US010454487B1

(12) United States Patent
Sedighi et al.

(10) Patent No.: US 10,454,487 B1
(45) Date of Patent: Oct. 22, 2019

(54) SEGMENTED RESISTOR ARCHITECTURE FOR DIGITAL-TO-ANALOG CONVERTERS

(71) Applicant: Qualcomm Incorporated, San Diego, CA (US)

(72) Inventors: Behnam Sedighi, La Jolla, CA (US); Andrew Weil, San Diego, CA (US); Nitz Saputra, Burlingame, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/118,019

(22) Filed: Aug. 30, 2018

(51) Int. Cl.
*H03M 1/08* (2006.01)
*H04B 1/16* (2006.01)
*H04B 1/04* (2006.01)

(52) U.S. Cl.
CPC ............. *H03M 1/0863* (2013.01); *H04B 1/04* (2013.01); *H04B 1/16* (2013.01)

(58) Field of Classification Search
CPC .................................................... H03M 1/0863
USPC ................................................. 341/154, 144
See application file for complete search history.

(56) References Cited

U.S. PATENT DOCUMENTS

| | | | |
|---|---|---|---|
| 6,583,744 B2 | 6/2003 | Bright | |
| 6,924,761 B2 | 8/2005 | Jiang et al. | |
| 7,042,381 B1 | 5/2006 | Pan | |
| 8,896,472 B2 | 11/2014 | Seo et al. | |
| 9,178,524 B1 | 11/2015 | Lee et al. | |
| 2014/0253357 A1* | 9/2014 | Seo ....................... | H03M 1/785 341/154 |

FOREIGN PATENT DOCUMENTS

EP     1031186 B1     1/2007

OTHER PUBLICATIONS

Kester W., "Basic DAC Architectures II: Binary DACs," MT-015 Tutorial, 2009, pp. 1-10.
Marche D., et al., "Modeling R-2R Segmented-Ladder DACs", IEEE Transactions on Circuits and Systems I: Regular Papers, Jan. 2010, vol. 57, Issue: 1, pp. 31-43.
Niejati B., et al., "An Area Optimized 2.5-V 10-b 200-MS/s 200-μA CMOS DAC", IEEE 2006 Custom Intergrated Circuits Conference (CICC), 2006, pp. 161-164.
Xu W., et al., "Research of Segmented 8bit Voltage-Mode R-2R Ladder DAC", IEEE 11th International Conference on ASIC (ASICON), 2015, 4 pages.

* cited by examiner

*Primary Examiner* — Peguy Jean Pierre
(74) *Attorney, Agent, or Firm* — Colby Nipper/Qualcomm

(57) ABSTRACT

The present disclosure describes aspects of segmented resistor architecture for digital-to-analog converters (DACs). In some aspects, a DAC circuit is implemented with a first resistor network coupled to a set of binary code-controlled current sources and a second resistor network that includes a resistor coupled between the first resistor network and an output of the DAC circuit. A set of thermometer code-controlled current sources are coupled to a node of the second resistor network and provide varying amounts of current. This current is scaled based on a resistance of the second resistor network's resistor, which is higher than a resistance of the first resistor network and effective to increase a combined output impedance of the first and second resistor networks. The increase of output impedance reduces noise of the resistor networks that transfers to the output of the DAC circuit, thereby improving signal-to-noise performance of the DAC circuit.

30 Claims, 14 Drawing Sheets

SEGMENTED RESISTOR ARCHITECTURE FOR DIGITAL-TO-ANALOG CONVERTERS

BACKGROUND

Field of the Disclosure

This disclosure relates generally to digital-to-analog converters (DACs), and more specifically to resistive DAC circuitry.

Description of Related Art

Many electronic and computing devices include digital-to-analog converters (DACs) to generate analog output signals based on digital input values. For example, a wireless modem, transceiver, or transmit chain of an electronic device includes DACs to implement various operations, such as complex digital modulation. These DACs are often implemented as current-steering DACs that may include a resistor-2resistor (R2R) section or R2R ladder through which output current is controlled by binary-weighted bits. The R2R ladder of the DAC, however, typically provides only a small portion of total DAC output current that correlates to a least significant bit (LSB) part of a digital input. At low levels of output current, noise associated with physical non-idealities of the DAC's components may degrade an output signal provided at an output of the DAC.

For example, individual resistors of the R2R ladder produce thermal noise that can build and transfer toward the output of the DAC along with the output current. Due to typically low output impedance of an R2R ladder, most of this thermal noise is passed directly to the output of the DAC and onto the output signal. As noted, at low levels of output current, this thermal noise may be substantial enough to reduce resolution of the DAC (e.g., an effective number of bits (ENOB) of the DAC). This loss in DAC resolution typically decreases signal-to-noise-and-distortion ratio (SNDR) and/or receive-band noise (RxBN) performance of a transmitter in which the DAC is embodied.

This description of related art is provided for the purpose of generally presenting a context for the disclosure that follows. Unless indicated otherwise herein, concepts described in this section are not prior art to this disclosure and are not admitted to be prior art by inclusion herein.

SUMMARY

In some aspects of segmented resistor architecture for digital-to-analog converters (DACs), a segmented resistor network of a DAC circuit is implemented with a first resistor network and a second resistor network. The first resistor network is coupled to a set of binary code-controlled current sources and the second resistor network is coupled between the first resistor network and an output of the DAC circuit. The second resistor network includes a resistor coupled to the output of the DAC circuit through which current can pass from the first resistor network to the output. A set of thermometer code-controlled current sources is coupled to a node of the second resistor network and provides varying amounts of current to the node based on thermometer-coded bit values. This current provided at or injected into the node is scaled based on a resistance of the resistor of the second resistor network, which is higher than an effective resistance of the first resistor network in some implementations. In contrast with a typical DAC R2R ladder segment (e.g., a pure R2R or binary LSB array), the higher resistance of the second network's resistor as described herein increases a combined output impedance of the first and second resistor networks above that of the typical DAC R2R ladder. This increase of output impedance reduces total amount of thermal noise that transfers from the first and second resistor networks to the output of the DAC circuit. In some aspects, a segmented resistor network as described herein can increase the output impedance of a resistor network by a factor of approximately four times versus that of a typical R2R ladder. This in turn may result in a reduction of noise power from resistor network at the DAC output by a factor of four.

The foregoing summary is provided to briefly introduce some of the aspects described herein. This summary is not intended to identify key or essential features of these or other aspects that are further described throughout the disclosure.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Figure 1:
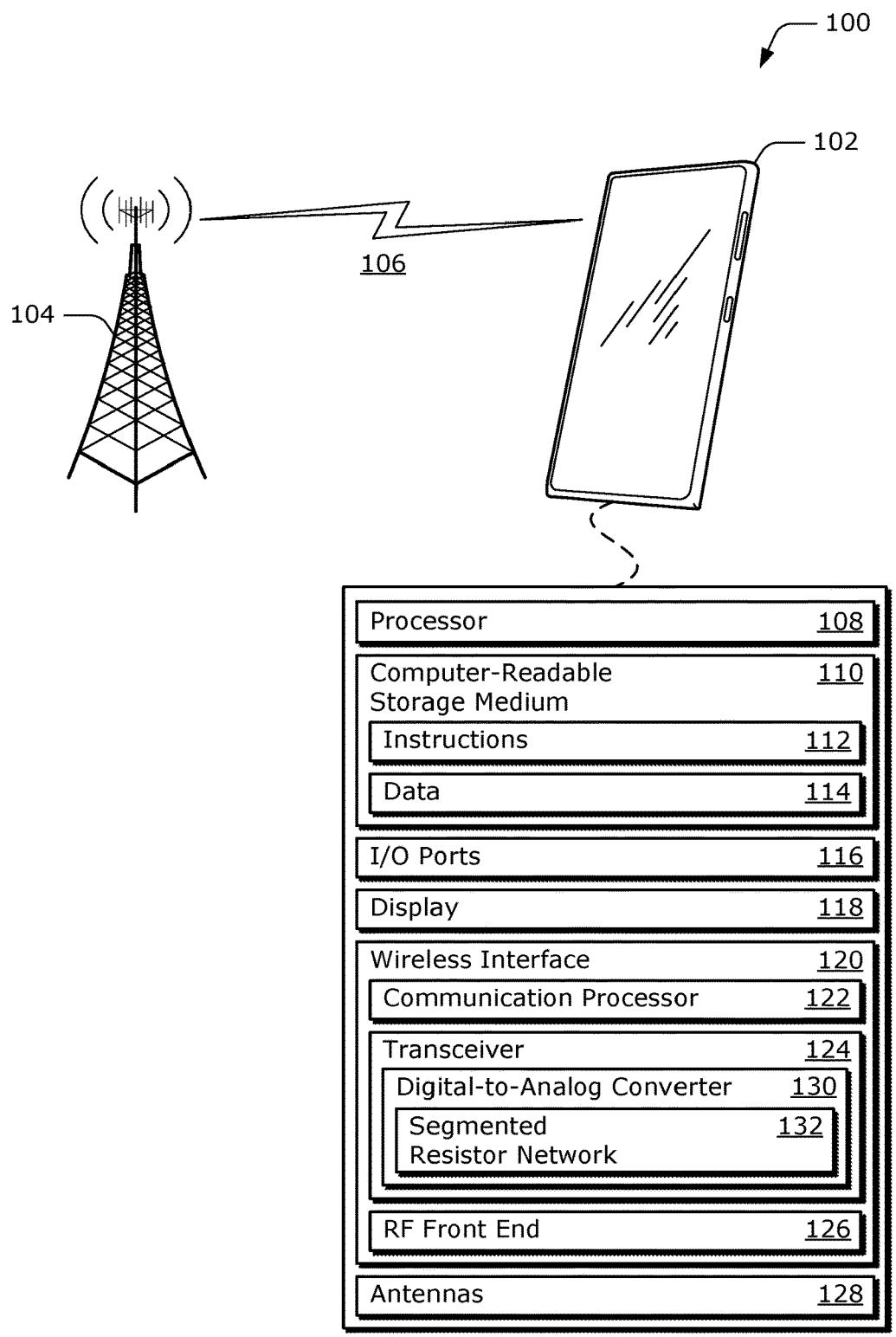
FIG. 1 illustrates an example environment that includes a computing device capable of wireless communication.

Conventionally implemented digital-to-analog converters (DACs) often include a resistor-2resistor (R2R) ladder through which a portion of output current is controlled by binary-weighted bits. For example, a least significant bit (LSB) array can be implemented with an R2R ladder through which current is provided by one set of binary code-controlled current sources. The LSB array, however, typically provides only a small portion of total DAC output current, such as a fraction of a unit of current ($I_U$) that is provided by each current source of a most significant bit (MSB) array of the DAC. At low levels of output current, thermal noise associated with the LSB array, particularly resistors of the R2R ladder, may dominate an output signal of the DAC. In some cases, the thermal noise of resistors in the R2R ladder in combination with low output impedance of a typical R2R DAC reduces a resolution of the R2R DAC (e.g., results in fewer ENOBs), which in turn impairs SNDR and RxBN performance of a transmitter in which the conventional R2R DAC is embodied.

In contrast, with aspects of segmented resistor architecture for DACs, an example DAC circuit is implemented with a segmented resistor network (e.g., a segmented resistive array) that includes a first resistor network and a second resistor network. The first resistor network is coupled to a set of binary code-controlled current sources and the second resistor network is coupled between the first resistor network and an output of the DAC circuit. The second resistor network includes a resistor coupled to the output of the DAC circuit through which a portion of current from the first resistor network passes. A set of thermometer code-controlled current sources is coupled to a node of the second resistor network and provides varying amounts of current to the node based on thermometer-coded bit values.

The current of the second resistor network is scaled at least partially based on a resistance of the resistor of the second resistor network, which is higher than an effective resistance of the first resistor network. In combination with the thermometer code-controlled current sources, the second resistor network can be used to achieve a transfer function similar to a binary code-controlled LSB array, yet with the higher resistance (e.g., output impedance). For example, the resistor of the second resistor network may have a resistance value that is greater than a resistor of the first resistor network or an effective total resistance of the first resistor network (e.g., Thevenin resistance). In contrast with a typical DAC R2R ladder segment, the higher resistance of the second resistor network's resistor increases a combined output impedance of the first and second resistor networks above that of a pure or homogenous R2R ladder array. This increased output impedance of the first and second resistor networks, as measured or seen from the output of the DAC, is effective to reduce an amount of noise (e.g., thermal current noise) that transfers from the resistor networks to the output of the DAC circuit. In some aspects, a segmented resistor network can increase the output impedance of the segmented resistor network by a factor of approximately four versus an output impedance of a typical R2R ladder. Such an increase in output impedance will result in a reduction of noise at the DAC output and an increase in an effective number of bits for the DAC. This in turn can improve SNDR or RxBN performance of a transmitter in which the DAC with segmented resistor architecture is embodied.

These and other aspects of segmented resistor architecture for DACs are described below in the context of an example environment, example segmented resistor networks, various techniques, and example apparatuses. Any reference made with respect to the example environment or circuit, or elements thereof, is by way of example only and is not intended to limit any of the aspects described in this disclosure.

Example Environment

FIG. 1 illustrates an example environment 100, which includes a computing device 102 that communicates with a base station 104 through a wireless communication link 106 (wireless link 106). In this example, the computing device 102 is depicted as a smart-phone. However, the computing device 102 may be implemented as any suitable computing or electronic device, such as a modem, audio coder-decoder (codec), cellular base station, broadband router, access point, cellular phone, gaming device, navigation device, media device, laptop computer, desktop computer, tablet computer, server, network-attached storage (NAS) device, smart appliance, vehicle-based communication system, precision controller, measurement instrument, analog-to-digital converter, Internet of Things (IoT) device, and the like.

Generally, the base station 104 communicates with the computing device 102 via the wireless link 106, which may be implemented as any suitable type of wireless link. Although shown as a base station, the base station 104 may represent or be implemented as another device, such as a satellite, cable television head-end, terrestrial television broadcast tower, access point, peer-to-peer device, mesh network node, fiber optic line, and the like, or as another device generally as described above. Therefore, the computing device 102 may communicate with the base station 104 or another device, via a wired connection, wireless connection, or a combination thereof.

The wireless link 106 may include a downlink of data or control information communicated from the base station 104 to the computing device 102 and an uplink of other data or control information communicated from the computing device 102 to the base station 104. The wireless link 106 can be implemented using any suitable communication protocol or standard, such as 3rd Generation Partnership Project Long-Term Evolution (3GPP LTE), Fifth Generation New Radio (5G NR), IEEE 802.11, IEEE 802.16, Bluetooth™, and the like.

The computing device 102 includes a processor 108 and computer-readable storage medium 110 (CRM 110). The processor 108 is hardware-based and may include any type of processor, such as a multi-core application processor, configured to execute processor-executable code stored by the computer-readable storage medium 110. The CRM 110 may include any suitable type or combination of data storage media, such as non-volatile memory (e.g., Flash memory), volatile memory (e.g., random access memory), optical media, magnetic media, or the like. In the context of this disclosure, the CRM 110 is implemented to store instructions 112, data 114, and other information of the computing device 102, and thus does not include transitory propagating signals or carrier waves.

The computing device 102 also includes input/output ports 116 (I/O ports 116) and a display 118. The I/O ports 116 enable data exchanges or interaction with other devices, networks, or users. The I/O ports 116 may include serial ports (e.g., universal serial bus ports), parallel ports, audio ports, infrared ports, cameras or other sensors, touch interfaces, and the like. The display 118 of the computing device 102 may present graphical content, such as a user interface associated with an operating system, program, or application. Alternately or additionally, the display 118 may be implemented as a display port or virtual interface, through which the graphical content of the computing device 102 is presented.

A wireless interface 120 of the computing device 102 provides connectivity to respective networks and peer devices via a wireless link, which may be configured similar to or differently from the wireless link 106. Alternately or additionally, the computing device 102 may include a wired interface, such as an Ethernet or fiber optic transceiver for communicating over a wired local network, intranet, or the Internet. The wireless interface 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the computing device 102 communicates various data and control information with the base station 104 via the wireless interface 120. However, the computing device 102 may communicate directly with other peer devices and the like.

The wireless interface 120 includes a communication processor 122, transceiver 124, and radio frequency front end 126 (RF front end 126) to process data and signals associated with communicating data of the computing device 102 over one or more antennas 128. The communication processor 122 may be implemented as a system-on-chip (SoC), a modem baseband processor, or a baseband radio processor (BBP) that enables a digital communication interface for data, voice, messaging, or other applications of the computing device 102. The communication processor 122 includes a digital signal processor or signal processing blocks (not shown) for encoding and modulating data for transmission, or demodulating and decoding received data. Additionally, the communication processor 122 may also manage (e.g., control or configure) aspects or operation of the transceiver 124, the RF front end 126, and other components of the wireless interface 120 to implement various communication protocols or communication techniques.

The transceiver 124 includes circuitry and logic for filtering, amplification, channelization, and frequency translation, which may be an up-conversion or down-conversion of frequency, performed in a single conversion, or through a plurality of conversion steps. The transceiver 124 also includes a digital-to-analog converter 130 (DAC 130) that is implemented with a segmented resistor network 132. The DAC 130 converts digital values to an analog signal for amplification and filtering by circuitry of the transceiver 124. The DAC 130 may be implemented as any suitable type of DAC, such as a single-ended DAC, current-steering DAC, differential DAC, segmented DAC, or circuitry to implement like functionality. The implementation and use of the segmented resistor network 132 varies, and is described throughout the disclosure. Although not shown, the transceiver 124 may also include an analog-to-digital converter (ADC) to convert analog signals to digital values.

The components or circuitry of the transceiver 124 can be implemented in any suitable fashion, such as combined transceiver logic or separately as respective receiver and transceiver entities. In some cases, the transceiver 124 is implemented with multiple or different sections to implement respective receiving and transmitting operations (e.g., separate transmit and receive chains). The transceiver 124 may also include logic to perform in-phase/quadrature (I/Q) operations, such as synthesis, phase correction, modulation, demodulation, and the like.

The RF front end 126 includes filters, switches, and amplifiers for conditioning signals received via the antennas 128 or signals to be transmitted via the antennas 128. The RF front end 126 may also include other RF sensors and components, such as a peak detector, power meter, gain control block, antenna tuning circuit, diplexer, balun, and the like. Configurable components of the RF front end 126 may be controlled by the communication processor 122 to implement communications in different modes or frequency bands.

Figure 2:
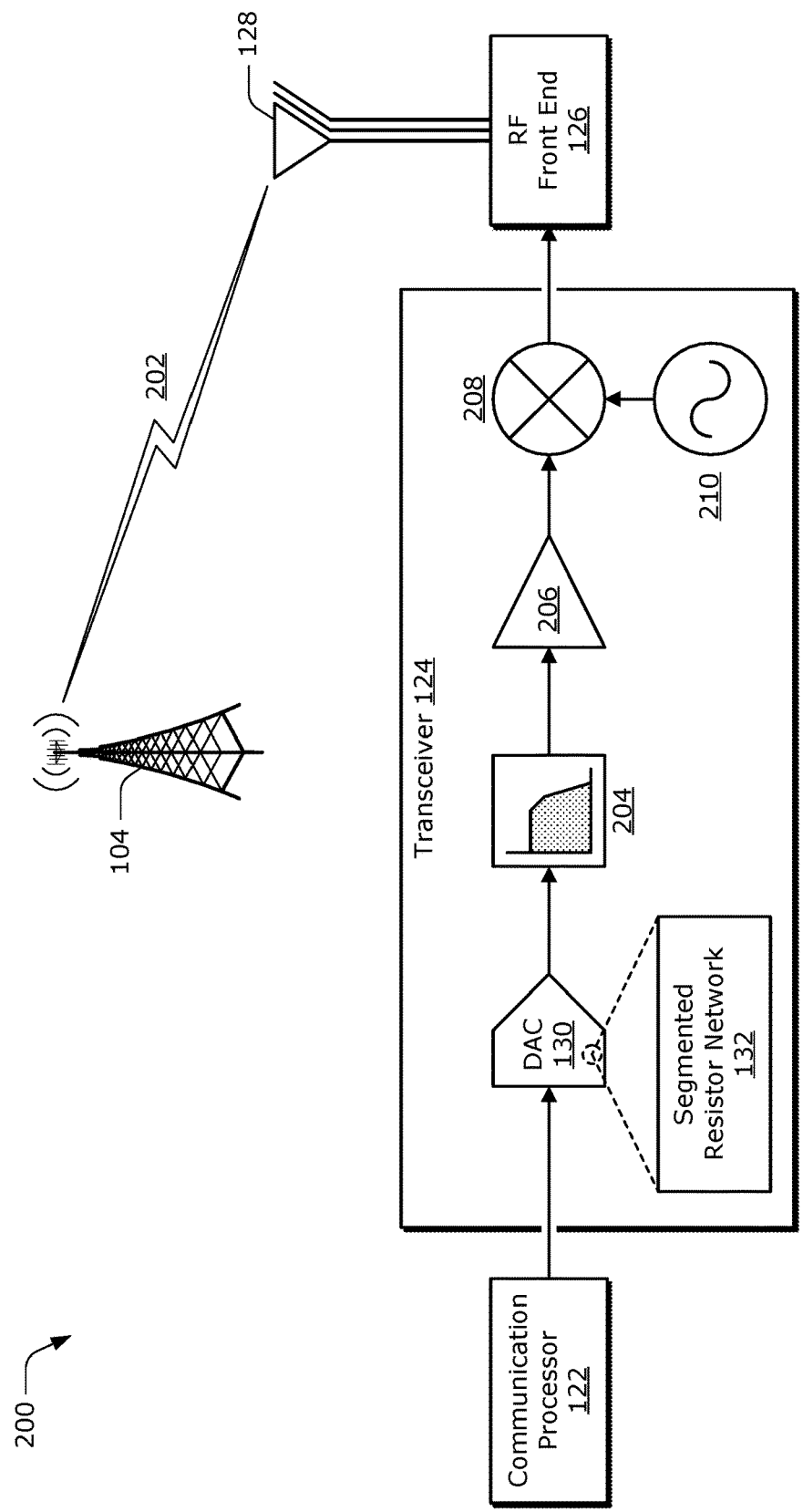
FIG. 2 illustrates an example configuration of a transceiver of a wireless computing device in FIG. 1.

FIG. 2 illustrates an example configuration of the wireless interface 120 generally at 200. In this particular example, the wireless interface 120 is transmitting, via the antennas 128, an RF signal 202 to the base station 104. The entities shown in FIG. 2 may be configured as a transmit chain or transmit path of the wireless interface 120 or transceiver 124. Although not shown, the wireless interface 120 may include a receive chain or receive path capable of performing complimentary operations to process received RF signals. The RF signal 202 may be communicated in accordance with any suitable communication protocol or standard, and may represent an uplink portion of the wireless link 106 as described with reference to FIG. 1.

Generally, the communication processor 122 encodes and modulates data of the wireless interface 120 to be transmitted and provides the modulated data to the DAC 130. The DAC 130 converts the modulated data provided by the communication processor 122 from a digital input signal to an analog output signal. The DAC 130 may be configured to receive digital values of any suitable size for conversion, such as values ranging from 8-bits to 20-bits in size. In this example, the DAC 130 is implemented as a differential DAC and with a segmented resistor network 132. The segmented resistor network 132 is implemented with a first resistor network coupled to a set of binary code-controlled current sources and a second resistor network coupled to a set of thermometer code-controlled current sources. In some aspects, a resistor of the second resistor network is coupled between the first resistor network and an output of the DAC 130 effective to provide a resistor-network output impedance that is greater than that of a typical R2R network. By so doing, the segmented resistor network 132 can reduce an amount of noise that transfers to the output of the DAC 130, thereby improving an SNR or increasing an ENOB parameter of the DAC 130. Example implementations of the segmented resistor network 132 are described below, including with reference to FIG. 3.

The analog signal (e.g., voltage- or current-based signal) output by the DAC 130 is then provided to a baseband filter 204 of the transceiver 124. The baseband filter 204, shown here as a low-pass filter, filters the analog signal output by the DAC 130 to remove high frequency artifacts or images that can be introduced by the digital-to-analog conversion operations of the DAC 130. Similar to the DAC 130, the baseband filter 204 can be implemented as a differential component to receive a differential analog signal output from the DAC 130.

An amplifier 206 of the transceiver 124 receives the filtered signal from the baseband filter 204 and amplifies the filtered signal to provide an amplified signal for up-conversion. In this example, the transceiver 124 includes a mixer 208 to receive the amplified signal from the amplifier 206 and a clock signal from a local oscillator 210. Based on the clock signal, the mixer 208 up-converts the amplified signal to provide an RF signal to the RF front end 126 or a driver amplifier (not shown) of the transceiver. For example, a driver amplifier of the transceiver 124 or RF front end 126 can amplify the RF signal prior to additional filtering or amplification via power amplifiers. Once amplified to a suitable power level for transmission, the RF signal is routed by switches of the RF front end 126 to one or more the antennas 128 for over-the-air transmission to the base station 104. This is but one example configuration of a transceiver that includes a DAC 130 implemented with a segmented resistor network 132, various examples of which are described throughout the disclosure (e.g., segmented resistor networks 132a-132e). The DAC 130 and/or the segmented resistor network 132 may be implemented in any other suitable transceiver configuration or within another component of the wireless interface 120, such as the communication processor 122 (e.g. an audio codec).

Figure 3:
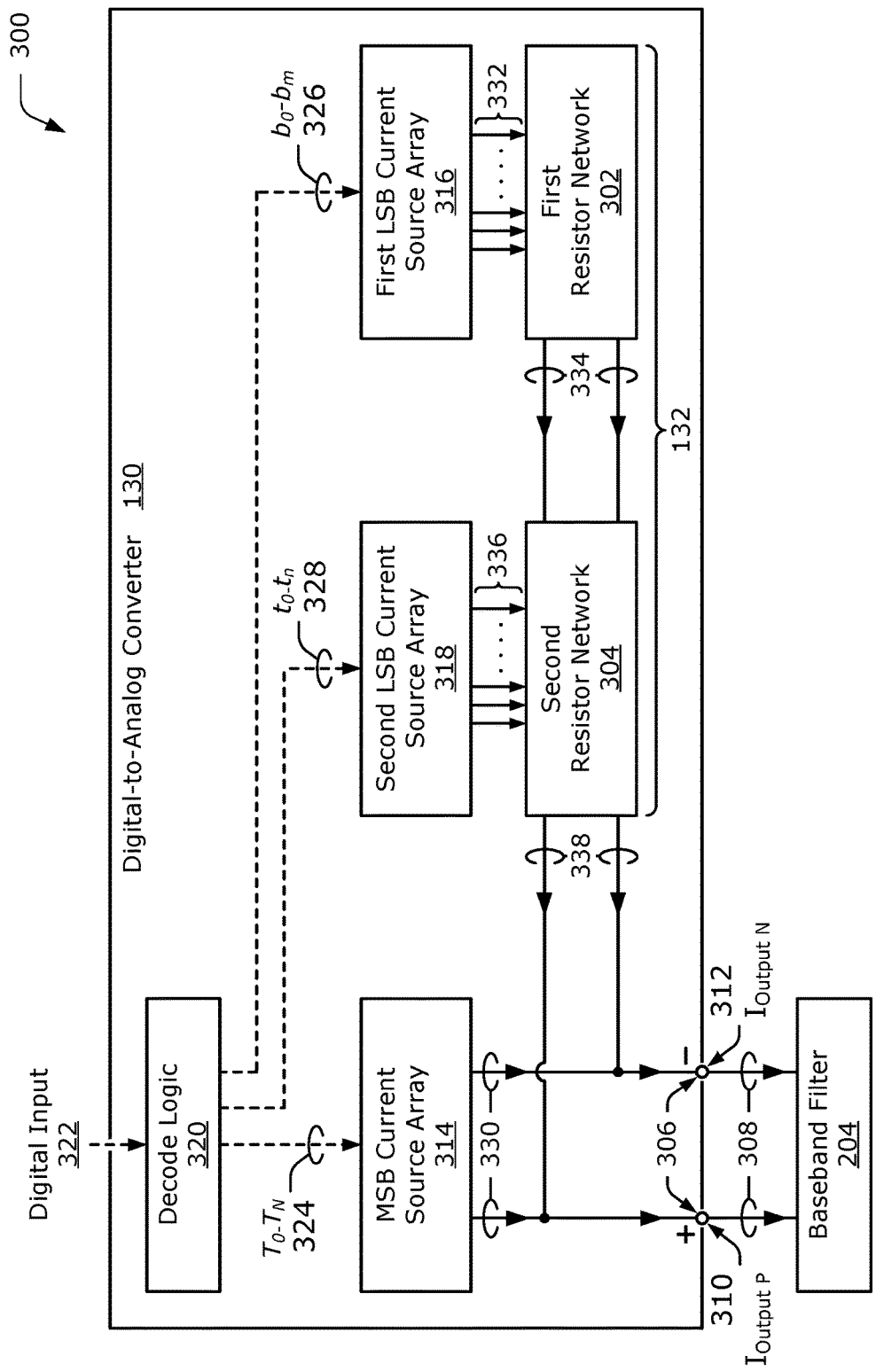
FIG. 3 illustrates an example configuration of a digital-to-analog converter (DAC) implemented with segmented resistor architecture.

FIG. 3 illustrates an example configuration of the digital-to-analog converter 130 (DAC 130) implemented with segmented resistor architecture at 300. In this example, a segmented resistor network 132 of the DAC 130 includes a first resistor network 302, which may be configured as a resistor ladder (e.g., R2R ladder), and a second resistor network 304. The second resistor network 304 can be coupled between the first resistor network 302 and an output 306 (e.g., a differential output 306) of the DAC 130. The DAC 130 is implemented as a current-steering DAC in which a portion of output current 308 is provided through the first resistor network 302 and the second resistor network 304 to the output 306 (e.g., a current-based output). Generally, the output current 308 of the DAC 130 is steered between a positive current output 310 and a negative current output 312 to which another component or load is connected. In the context of the DAC 130 being embodied as part of the transceiver 124, here the baseband filter 204 (e.g., transmit baseband filter) is connected to the output 306 of the DAC 130.

Current of the DAC 130 is provided by multiple current sources, which can be grouped into arrays of current sources that provide respective portions of the output current 308. In this example configuration, the multiple current sources of the DAC 130 are implemented as a most significant bit (MSB) current source array 314, a first least significant bit (LSB) current source array 316, and a second LSB current source array 318. As shown in FIG. 3, the first LSB current source array 316 is coupled to the first resistor network 302, and the second LSB current source array 318 is coupled to the second resistor network 304. Each of the current source arrays 314 through 318 can be implemented with any number of individual current sources to provide respective current that is steered, at least in part, to the output 306 of the DAC 130. In some cases, each of the multiple current sources of the DAC 130 are configured to provide a same amount of current, such as a unit amount of current or a unit of current ($I_U$).

To control steering of the current, the DAC 130 includes decode logic 320 that generates signals or bit values based on a digital input 322 received from a digital interface (not shown), such as the communication processor 122. The decode logic 320 may include any suitable combination of logic gates, devices, or circuitry for converting the digital input 322 into respective binary-coded and thermometer-coded signals or bit values to steer the current of the current source arrays of the DAC 130. Generally, the decode logic 320 steers current of a current source array by directing respective current provided by current sources of the array to a positive branch or a negative branch of current-summing circuitry coupled to an output of the current source array.

As implied by the naming convention of the current source arrays, the decode logic 320 provides a first set of thermometer-coded bit values $T_0$-$T_N$ 324 for the MSB current source array 314 based on most significant bits of the digital input 322. The decode logic 320 also provides, based on least significant bits of the digital input 322, a set of binary-coded bit values $b_0$-$b_m$ 326 for the first LSB current source array 316 and a second set of thermometer-coded bit values $t_0$-$t_n$ 328 for the second LSB current source array 318. Respective numbers of the bit value sets 324 through 328 provided by the decode logic 320 may correspond to a number of current sources in each array, where "N", "n", or "m" are any suitable integers. For visual clarity, bit values or signals associated with MSB current sources are indicated with uppercase letters (e.g., $T_N$) and those associated with LSB current sources are indicated with lowercase letters (e.g., $t_n$).

The steered current of the current source arrays 314 through 318 is summed to provide the output current 308 of the DAC 130. As shown in FIG. 3, the MSB current source array 314 is coupled to the output 306 and provides MSB current 330 (e.g., multiple units of current) to the output 306 based on the thermometer-coded bit values $T_0$-$T_N$ 324. Current 332 provided by the first LSB current source array 316 based on the binary-coded bit values $b_0$-$b_m$ 326 is scaled or weighted by the first resistor network 302 to provide a first portion of LSB current 334. In some aspects, the first resistor network is configured as a resistor-2resistor (R2R) section or R2R ladder by which the current 332 of the first LSB current source array is scaled. This first portion of LSB current 334 also flows through the second resistor network 304, which is coupled between the first resistor network 302 and the output 306 of the DAC 130.

The second LSB current source array 318 provides, based on the thermometer-coded bit values $t_0$-$t_n$ 328, current 336 that is scaled or weighted by the second resistor network to provide a second portion of LSB current (not explicitly shown). In some aspects, the second resistor network 304 sums or combines the first portion of LSB current 334 with the second portion of LSB current of the second resistor network to provide LSB current 338. As indicated by the directional arrows of FIG. 3, the output current 308 of the DAC 130 includes a sum of the MSB current 330 from the MSB current source array 314 and the LSB current 338 provided through or by the second resistor network 304. Here, note that the second resistor network 304 of the segmented resistor network 132 is coupled to the output 306 of the DAC 130. With this configuration, the baseband filter 204 is not coupled directly to the first resistor network 302, which has a lower effective resistance than a combined resistance of the first resistor network 302 and second resistor network 304. As such, the segmented resistor network 132 features an increased output impedance that is effective to reduce an amount of thermal noise from transferring from the first resistor network 302 to the output 306 of the DAC 130 and thus to the baseband filter 204.

Figure 4:
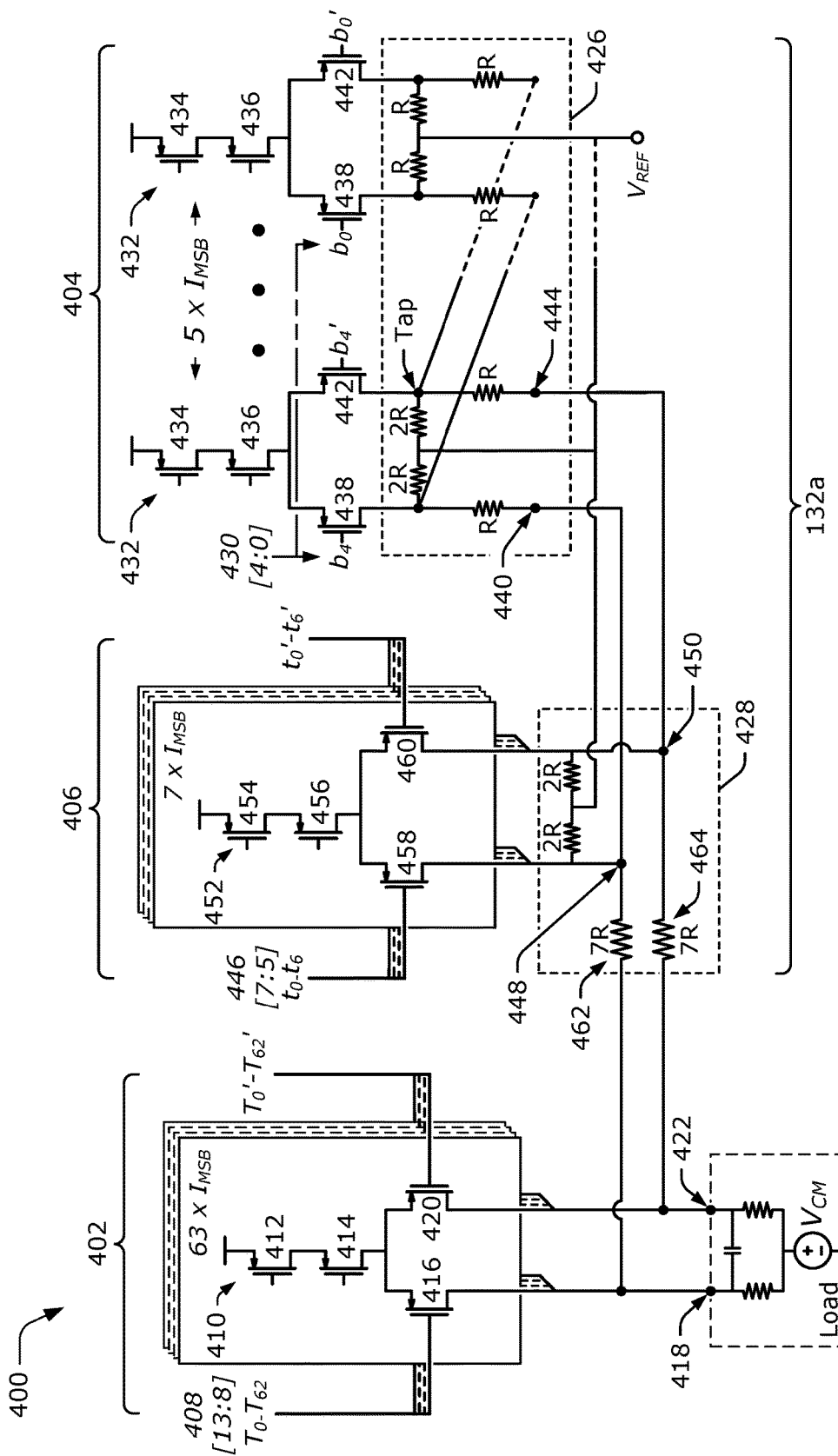
FIG. 4 illustrates an example differential DAC circuit implemented with a segmented resistor architecture in accordance with one or more aspects.

FIG. 4. illustrates an example differential DAC circuit 400 that is implemented with a segmented resistor architecture. A differential DAC circuit with a segmented resistor architecture may be implemented to convert a digital input of any suitable size or bit-width to a corresponding analog output, such as a 10-bit DAC, 12-bit DAC, 15-bit DAC, and so on. In this example, the differential DAC circuit 400 is implemented as a 14-bit DAC circuit that is configured to convert a 14-bit input (e.g., [13:0]) to an analog output signal. The differential DAC circuit 400 includes an MSB segment 402 to convert six MSB inputs (e.g., [13:8]), a binary-coded LSB segment 404 to convert five LSB inputs (e.g., [4:0]), and a thermometer-coded LSB segment 406 to convert three LSB inputs (e.g., [7:5]) to provide the digital output signal. Here, the binary-coded LSB segment 404 and thermometer-coded LSB segment 406 are coupled to a segmented resistor network 132a of the DAC circuit 400.

With reference to the current sources and switches of the MSB segment 402, binary-coded LSB segment 404, and thermometer-coded LSB segment 406, these elements are shown as individual components that may represent or be implemented to provide functionality of similar elements shown throughout the figures and/or described in this disclosure. Further, although shown as being implemented with P-channel metal-oxide-semiconductor field-effect transistors (P-FETs), switches, switch devices, and/or various current sources, the circuits or aspects described herein may also be implemented as other components or topologies, such as N-channel FETs, bipolar junction transistors (BJTs), and/or a circuitry implemented with reversed power rails, inverted control signals, current sinks, or complimentary transistor types.

The MSB segment 402 of the differential DAC circuit 400 includes 63 stages configured to steer current based on a set of MSB inputs 408 (e.g., $B_{13}$-$B_8$) that are decoded into 63 thermometer-coded bit values or control signals (e.g., $T_0$-$T_{62}$). Each stage of the MSB segment 402 includes a current source 410 formed by two P-FETs 412, 414 that provide a unit of current ($I_U$), which in this example is referenced to an MSB unit of current ($I_{MSB}$). In some cases, the two P-FETs 412, 414 (or other current sources described herein) are implemented as a cascoded PMOS current source or a cascode PMOS current source for each stage or unit element to provide the unit of current. Alternately, units of current of the differential DAC circuit 400 can be referenced to LSB units of current ($I_{LSB}$), such that a sum of an LSB segment or LSB segment provides one $I_{LSB}$ and current sources of other portions or segments of the DAC circuit provide multiples of the $I_{LSB}$.

Returning to FIG. 4, the current of each MSB stage is steered, based on a decoded MSB input bit ($T_N$), by a P-FET 416 to a positive output 418 of the differential DAC circuit 400 or by another P-FET 420 to a negative output 422 of the differential DAC circuit 400. These P-FETs 416, 420 may also be referred to switches or switch devices, such as a first pair or first set of switches (e.g., MSB stage switches) of a DAC circuit. Here, each input bit value or control signal ($T_N$) of the MSB inputs 408 is shown with a complimentary bit value or control signal ($T_N'$) to steer a respective unit of current to (or between) the positive current branch or the negative current branch of the differential DAC circuit 400. For example, if a decoded bit value (e.g., $T_{19}$) is zero, a control signal to a gate of the corresponding P-FET 416 will be low, thus activating the corresponding P-FET 416 to steer a unit of current to the positive output 418. Conversely, the complimentary decoded bit value (e.g., $T_{19}'$) would be one, and a control signal to a gate of the corresponding P-FET 420 will by high, which will deactivate the P-FET 420 effective to prevent current from flowing to the negative output 422. As such, switches of the MSB segment 402 steer, based on the MSB inputs 408, approximately 63 $I_{MSB}$ units of current between the outputs 418 and 422 to a differential load 424 (e.g., baseband transmit filter) that is coupled to the outputs of the differential DAC circuit 400.

The binary-coded LSB segment 404 and thermometer-coded LSB segment 406 of the differential DAC circuit 400 are configured to provide current to the outputs 418 and 422 through respective segments or portions of the segmented resistor network 132a. In some aspects of segmented resistor architecture, a resistive structure of a DAC through which current flows includes at least two segments of heterogeneous resistor networks or resistors of different values. In this example, the segmented resistor network 132a of the differential DAC circuit 400 includes a first resistor network 426 and a second resistor network 428. With respect to the current sources, the binary-coded LSB segment 404 is coupled to the first resistor network 426, and the thermometer-coded LSB segment 406 is coupled to the second resistor network 428. The second resistor network 428 is coupled or disposed between the first resistor network 426 and the outputs 418 and 422 of the differential DAC circuit 400. In some cases, the first resistor network 426 is configured as a resistor-2resistor ladder with a first set of resistors having one resistance value (R) and a second set of resistors having a resistance value that is approximately twice that of the first set (R2).

The binary-coded LSB segment 404 of the differential DAC circuit 400 includes five stages that are configured to steer current to respective taps of the first resistor network 426 based on a set of binary-coded LSB bits 430 (e.g., bits [4:0]) by which five bit values or control signals (e.g., $b_4$-$b_0$) are provided. Generally, the taps of the first resistor network are located or formed between resistors (e.g., resistors of resistance value R) of the resistor network or resistor ladder that are coupled in series. In some cases, the first resistor network 426 or another resistor ladder is configured such that each successive tap scales injected current by half of a scaling of a previous tap in the resistor network (e.g., by $\frac{1}{8}$, $\frac{1}{16}$, $\frac{1}{32}$, etc. moving toward an LSB input or tap). Each stage of the binary-coded LSB segment 404 includes a current source 432 formed by two P-FETs 434, 436 that provide a unit of current ($I_U$), which in this example is referenced to an MSB unit of current ($I_{MSB}$). Accordingly, the five stages of the binary-coded LSB segment 404 are configured to provide five MSB units of current to respective taps of the first resistor network 426.

The current of each binary-coded LSB stage is steered, based on a binary-coded input bit ($b_n$), by a P-FET 438 toward a positive output 440 of the first resistor network 426 or by another P-FET 442 toward a negative output 444 of the first resistor network 426. These P-FETs 438, 442 may also be referred to switches or switch devices, such as a second pair or second set of switches (e.g., binary-LSB stage switches) of a DAC circuit. As shown in FIG. 4, each input bit or control signal ($b_n$) of the binary-coded LSB bits 430 is shown with a complimentary bit value or control signal ($b_n'$) to steer a respective unit of current to (or between) a positive current tap or negative current tap of the first resistor network 426. For example, one of P-FET 438 or P-FET 442 of each stage is activated by a corresponding control signal ($b_n$) or complimentary control signal ($b_n'$) to steer current of that stage to either one of the positive current taps or one of the negative current taps (but not both) of the first resistor network 126. In other words, current provided by a binary-coded LSB stage is steered by a respective P-FET 438 or P-FET 442 (e.g., switches) into a positive current branch or negative current branch of the first resistor network 426. Based on a respective location of a tap in the resistor ladder of the first resistor network 426, this current is scaled such that each successive tap contributes approximately half as much current to the outputs 440, 444 than that of a previous tap (e.g., moving left to right, $\frac{1}{16}$ $I_{MSB}$ to $\frac{1}{256}$ $I_{MSB}$, with the thermometer-coded current sources providing current in increments of $\frac{1}{8}$ $I_{MSB}$). Generally, the current is scaled fractionally based on a number of taps (or stages), resistance values of the resistors in the resistor ladder, and a resistance (e.g., input impedance) of the second resistor network 428. As such, the five $I_{MSB}$ units of current steered between the positive and negative current branches of the first resistor network 426 inject a fraction of an $I_{MSB}$ unit of current into the second resistor network 428, and thus toward the outputs 418 and 422 of the differential DAC circuit 400.

The thermometer-coded LSB segment 406 of the differential DAC circuit 400 includes seven stages that are configured to steer current based on a set of LSB inputs 446 (e.g., $B_7$-$B_5$) that are decoded into seven thermometer-coded bit values or control signals (e.g., $t_0$-$t_6$). As shown in FIG. 4, each thermometer-coded bit value or control signal ($t_n$) of the LSB inputs 446 is shown with a complimentary bit value or control signal ($t_n'$) to steer a respective unit of current to (or between) a first node 448 (e.g., positive current node) or a second node 450 (e.g., negative current node) of the second resistor network 428. Generally, the seven stages of the thermometer-coded LSB segment 406 have outputs that are coupled to the respective nodes 448 and 450 of the second resistor network 428. Based on the thermometer-coded bit values, the thermometer-coded LSB segment 406 of the differential DAC circuit 400 injects current into the nodes 448 and 450 of the second resistor network 428. In this example, each stage of the thermometer-coded LSB segment 406 includes a current source 452 formed by two P-FETs 454, 456 that provide a unit of current ($I_U$), which in this example is referenced to an MSB unit of current ($I_{MSB}$). For each stage, current provided by the two P-FETs 454, 456 is steered by a respective one of P-FET 458 or P-FET 460 into the first node 448 or second node 450 of the second resistor network 428. These P-FETs 458, 460 may also be referred to switches or switch devices, such as a third pair or third set of switches (e.g., thermometer-LSB stage switches) of a DAC circuit. For example, one of P-FET 458 or P-FET 460 of each stage is activated by the corresponding control signal ($t_n$) or the complimentary control signal ($t_n'$) to steer (or switch) current of that stage to either one of the first node 448 or second node 450 of the second resistor network 428. Accordingly, the seven stages of the thermometer-coded LSB segment 406 are configured to steer seven MSB units of current to the second resistor network 428 between the respective nodes 448 and 450.

In aspects of segmented resistor architecture, the second resistor network 428 is coupled between the first resistor network 426 and the outputs 418 and 422 of the differential DAC circuit 400. The second resistor network 428 includes the respective nodes 448 and 450 into which current is injected by the seven thermometer-coded LSB stages. The second resistor network 428 also includes at least two resistors 462 and 464 (for a differential implementation) that are coupled to the outputs 418 and 422 of the differential DAC circuit 400, respectively. Generally, the current provided by the thermometer-coded (or unary coded) LSB stages is scaled based on a resistance value of the resistors 462 and 464 and on an output impedance of the first resistor network 426.

In this example, a resistance value of the resistors 462 and 464 is approximately seven times an effective or output resistance value of the first resistor network 426. With this configuration, each of the seven thermometer-coded LSB stages provide or contribute approximately an eighth of an MSB unit of current to one of the outputs 418 or 422 based on the steering controlled by the thermometer-coded bit values. Accordingly, the differential DAC circuit 400 is capable of providing a portion of LSB current at a resolution of $\frac{1}{256} I_{MSB}$ of current, with the thermometer-coded LSB segment 406 steering a range of $\frac{1}{8} I_{MSB}$ to $\frac{7}{8} I_{MSB}$ of current and the binary-coded LSB segment 404 steering a range of $\frac{1}{16} I_{MSB}$ to $\frac{1}{256} I_{MSB}$ of current.

The resistance of the resistors 462 and 464, which is approximately seven times greater than an effective resistance of a homogenous R2R ladder, also provides an effective output impedance for the segmented resistor architecture (e.g., approximately 8R) that is higher than that of a typical resistor network of a DAC circuit (e.g., approximately R). This increased output impedance of the first and second resistor networks, as measured or seen from the output of the DAC, is effective to reduce an amount of noise (e.g., thermal noise) that transfers from the resistor networks of the segmented resistor architecture to the output of the DAC circuit.

By way of example, consider equation 1, which describes thermal noise current of a resistive element or structure, such as a resistor network of a DAC circuit. With reference to equation 1, the thermal noise current ($I_{TN}$) of a resistor squared (for a given bandwidth ($\Delta f$)) is equal to the product of four times Boltzmann's constant ($K_b$) times the resistor's absolute temperature T divided by a resistance (R) of the resistor.

Equation 1: Thermal Noise Current ($I_{TN}$) of a Resistor $$I_{TN}^2 = \frac{4K_b T \Delta f}{R}$$

Here, note that the resistance R of the resistor is in a denominator in the equation 1 for thermal noise current of the resistor network. This results in an inverse relationship between resistance (e.g., a resistance value) of the resistor and an amount of thermal noise current generated or transferred by the resistor. In other words, a resistor with a low resistance value will introduce more thermal noise current into a circuit than another resistor with a higher resistance value. For a DAC circuit without segmented resistor architecture, an effective resistance of a binary section R2R ladder formed with resistors with respective values of R and 2R is approximately R, which transfers a high level of thermal noise current to an output of the DAC circuit.

In contrast with this low-impedance, the DAC circuits described with reference to a segmented architecture include a resistor network segment disposed between an R2R ladder and an output of a DAC circuit to provide a segmented resistor network with higher output impedance. For example and as shown in FIG. 4, the segmented resistor architecture of the first resistor network 426 and second resistor network 428 has an effective resistance (8R) eight times greater than a typical R2R ladder (R). With the inverse relationship of resistance and thermal noise current, the increased output impedance of a segmented resistor architecture can reduce an amount of thermal noise current generated by resistor network to $\frac{1}{8}$. This reduction in thermal noise current may increase precision or an effective number of bits for the DAC, which in turn improves a SNDR or RxBN performance of a transmitter in which the DAC is embodied. Alternately or additionally, the higher impedance presented at the output of the DAC circuit may result in increased stability for loads coupled to the DAC circuit, such as a filter or other receive component. This in turn can reduce design complexity and enable easier optimization or tuning of downstream components (e.g., baseband filter).

Figure 5:
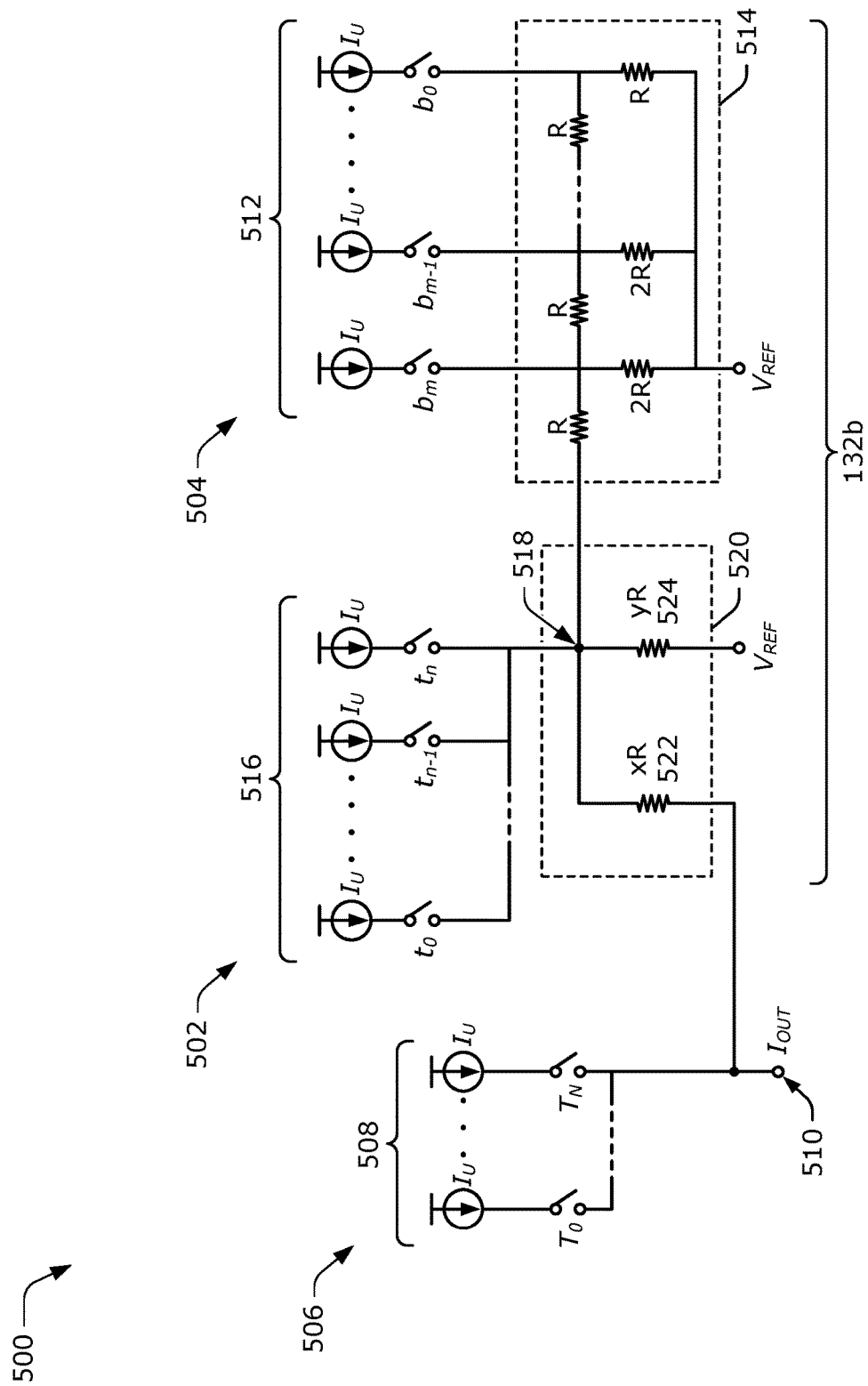
FIG. 5 illustrates an example DAC circuit with a least significant bit (LSB) array that includes a thermometer-coded segment and a binary-coded segment.

FIG. 5 illustrates an example DAC circuit 500 with an LSB bit array that includes a thermometer-coded segment 502 and a binary-coded segment 504. In this example, the DAC circuit 500 is shown as a single-ended circuit, though the DAC circuit 500 may be implemented as a differential DAC circuit, such as those described with respect to FIGS. 3 and 4. For visual brevity, decode logic that controls the current-steering switches of the DAC circuit 500 has been omitted, though examples of which are described throughout this disclosure. The DAC circuit 500 also includes an MSB segment 506 of current sources 508 (e.g., current source array) having respective outputs coupled to an output 510 of the DAC circuit 500. The respective segments of the DAC circuit 500 may include any suitable number of current sources that are configured to provide a unit of current ($I_U$), which may be referenced to an MSB unit of current ($I_{MSB}$) or an LSB unit of current ($I_{LSB}$). The current sources or switch elements of the DAC circuit 500 may be implemented similar to, or differently from, those described in the disclosure, such as with P-FET or N-FET devices.

In this example, the current sources 508 of the MSB segment 506 are implemented as thermometer code-controlled current sources and are configured to steer current to the output 510 of the DAC circuit 500 based on thermometer-coded bits ($T_0$-$T_N$), where N is any suitable integer. In some cases, the current sources 508 or a current source array of the MSB segment are coupled directly to the output 510 of the DAC circuit 500. Alternately or additionally, the MSB segment 506 can be implemented with binary code controlled current sources or with current sources that are configured differently from current sources of other segments of the DAC circuit.

The thermometer-coded segment 502 and the binary-coded segment 504 are configured to provide current to the output 510 through a segmented resistor network 132b of the DAC circuit 500. In this example, respective current sources 512 of the binary-coded segment 504 are coupled to taps of a first resistor network 514 of the segmented resistor network 132b. The current sources 512 of the binary-coded segment 504 are implemented as binary code-controlled current sources and configured to steer current into the first resistor network 514 based on binary-coded bits ($b_0$-$b_m$), where m is any suitable integer. The first resistor network 514 is configured as a resistor-2resistor ladder with a first set of resistors having one resistance value (R) and a second set of resistors having a resistance value that is approximately twice that of the first set (R2).

Current sources 516 of the thermometer-coded segment 502 are coupled to a node 518 of a second resistor network 520 of the segmented resistor network 132b. The current sources 516 of the thermometer-coded segment 502 are implemented as thermometer code-controlled current sources and configured to steer current into the node 518 based on thermometer-coded bits ($t_0$-$t_n$), where n is any suitable integer. The second resistor network 520 includes a first resistor 522 coupled between the node 518 and the output 510 of the DAC circuit 500 and a second resistor 524 coupled between the node 518 and a reference voltage. Although not shown, the second resistor network 520 may also include capacitors for bandwidth-tuning, filtering, improving resistor network impedance ratio accuracy, or the like.

Generally, the current injected into the node 518 by the thermometer code-controlled current sources 516 is scaled based on a resistance value of the first and second resistors 522, 524, and an output impedance of the first resistor network 514. Here, resistance values of the first and second resistors 522, 524 are shown as multiples "x" and "y" of a base resistor value (R) of the first resistor network 514. In aspects of segmented resistor architecture, the resistance value of the first resistor 522 is at least greater than R, such as a range of approximately 3R to 15R for various DAC configurations. A resistance of the second resistor 524 may be configured to similar resistors that are part of a dump path of the first resistor network 514, such as a resistance value of 2R.

The resistance of the first resistor 522, which is greater than an effective resistance of a homogenous R2R ladder, provides an effective output impedance for the segmented resistor network 132b that is higher than that of a typical resistor network of a DAC circuit (e.g., approximately R). The increased output impedance provided by the segmented resistor network 132b is effective to reduce an amount of noise (e.g., thermal noise) that transfers from the resistor networks 514 and 520 to the output 510 of the DAC circuit.

Figure 6:
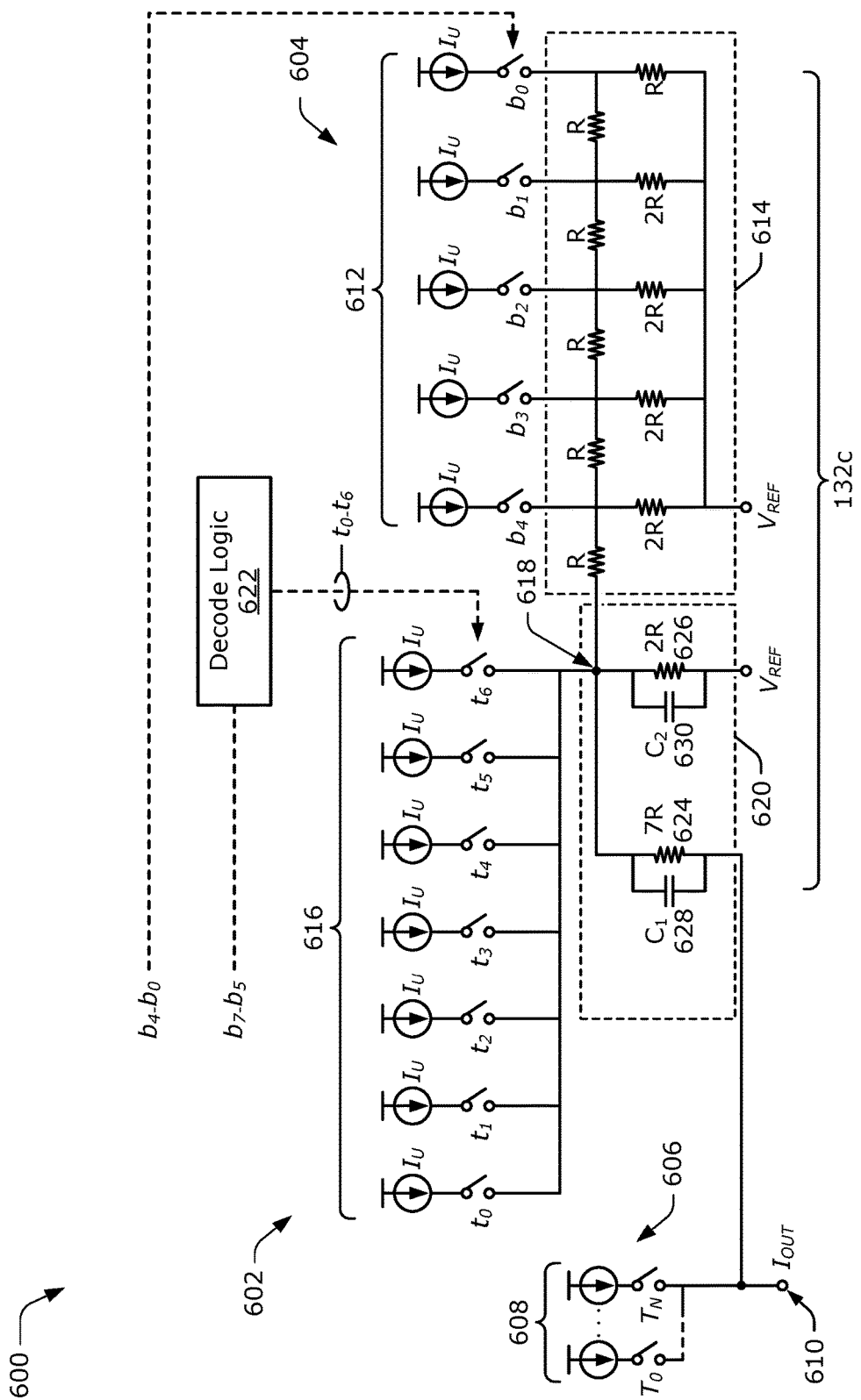
FIG. 6 illustrates another example DAC circuit implemented with an LSB bit array that includes a thermometer-coded segment and a binary-coded segment.

FIG. 6 illustrates another example DAC circuit implemented with a thermometer-coded segment 602 and binary-coded segment 604. In this example, the DAC circuit 600 is shown as a single-ended circuit, though the DAC circuit 600 may be implemented as a differential DAC circuit, such as those described with respect to FIGS. 3 and 4. For visual brevity, some decode logic that controls the current-steering switches of the DAC circuit 600 has been omitted, though examples of which are described throughout this disclosure. The DAC circuit 600 includes an MSB segment 606 of current sources 608 (e.g., current source array) having respective outputs coupled to an output 610 of the DAC circuit 600. The respective segments of the DAC circuit 600 may include any suitable number of current sources that are configured to provide a unit of current ($I_U$), which may be referenced to an MSB unit of current ($I_{MSB}$) or an LSB unit of current ($I_{LSB}$). The current sources or switch elements of the DAC circuit 600 may be implemented similar to, or differently from, those described in the disclosure, such as with P-FET or N-FET devices.

In this example, the current sources 608 of the MSB segment 606 are implemented as thermometer code-controlled current sources and are configured to steer current to the output 610 of the DAC circuit 600 based on thermometer-coded bits ($T_0$-$T_N$), where N is any suitable integer. The thermometer-coded segment 602 and a binary-coded segment 604 are configured to provide current to the output 610 through a segmented resistor network 132c of the DAC circuit 600. In this example, respective current sources 612 of the binary-coded segment 604 are coupled to taps of a first resistor network 614 (e.g., an R2R resistor ladder) of the segmented resistor network 132c. The current sources 612 of the binary-coded segment 604 are implemented as binary code-controlled current sources and configured to steer current into the first resistor network 614 based on binary-coded bits ($b_0$-$b_4$), which can be provided from any suitable decode logic.

Current sources 616 of the thermometer-coded segment 602 are coupled to a node 618 of a second resistor network 620 of the segmented resistor network 132c. The current sources 616 of the thermometer-coded segment 602 are implemented as seven thermometer code-controlled current sources or as an array of thermometer code-controlled current sources. In this example, the DAC circuit 600 includes an instance of decode logic 622 for converting three binary input bits ($b_7$-$b_5$) to seven thermometer-coded bits ($t_0$-$t_6$) to control the current sources 616. As such, the current sources 616 steer current into the node 618 of the second resistor network based on the thermometer-coded bits ($t_0$-$t_6$).

The second resistor network 620 includes a first resistor 624 coupled between the node 618 and the output 610 of the DAC circuit 600 and a second resistor 626 coupled between the node 618 and a reference voltage. In this example, the DAC circuit 600 also includes a first capacitor 628 ($C_1$ 628) coupled in parallel with the first resistor 624 and a second capacitor 630 ($C_2$ 630) coupled in parallel with the second resistor 626. Respective values of the first and second capacitors 628, 630 may be adjusted to optimize performance of the DAC circuit 600 for process variations or operating environments. In aspects of segmented resistor architecture, a DAC circuit may be implemented with fewer tuning capacitors (e.g., two bandwidth-tuning capacitors), which can reduce design complexity. The capacitors of the DAC circuit 600 may also compensate for parasitic capacitance of the segmented resistor architecture or improve resistor network impedance ratio accuracy, such as at higher frequencies. Depending on various design requirements for a DAC circuit, parameters of the segmented resistor architecture (e.g., binary/thermometer segmentation or number of unit current sources) can be selected to optimize or balance power dissipation, output impedance (and noise of the R2R network), power consumption, resistor network segmentation complexity, and/or total semiconductor area occupied by the current sources, resistors, capacitors, and switch devices (e.g., P-FETs).

Generally, the current injected into the node 618 by the current sources 616 is scaled based on a resistance value of the first and second resistors 624, 626, and an output impedance of the first resistor network 614. In this example, a resistance value of the first resistor 624 is seven times (7R) a resistance value of a series resistor (R) of the first resistor network 614. As such, the current provided by the current sources 616 may be scaled similar to the current scaling as described with reference to FIG. 4. With reference to the DAC circuit 600, the resistance value of the first resistor 624 is seven times greater than a resistance of the first resistor network 614. This provides for a segmented resistor network 132c with an output impedance (e.g., approximately 8R) that is higher than that of a typical resistor network of a DAC circuit (e.g., approximately R). As such, the increased output impedance of the first and second resistor networks 614, 620 is effective to reduce an amount of noise (e.g., thermal noise) that transfers from the resistor networks of the segmented resistor architecture to the output of the DAC circuit 600.

Figure 7:
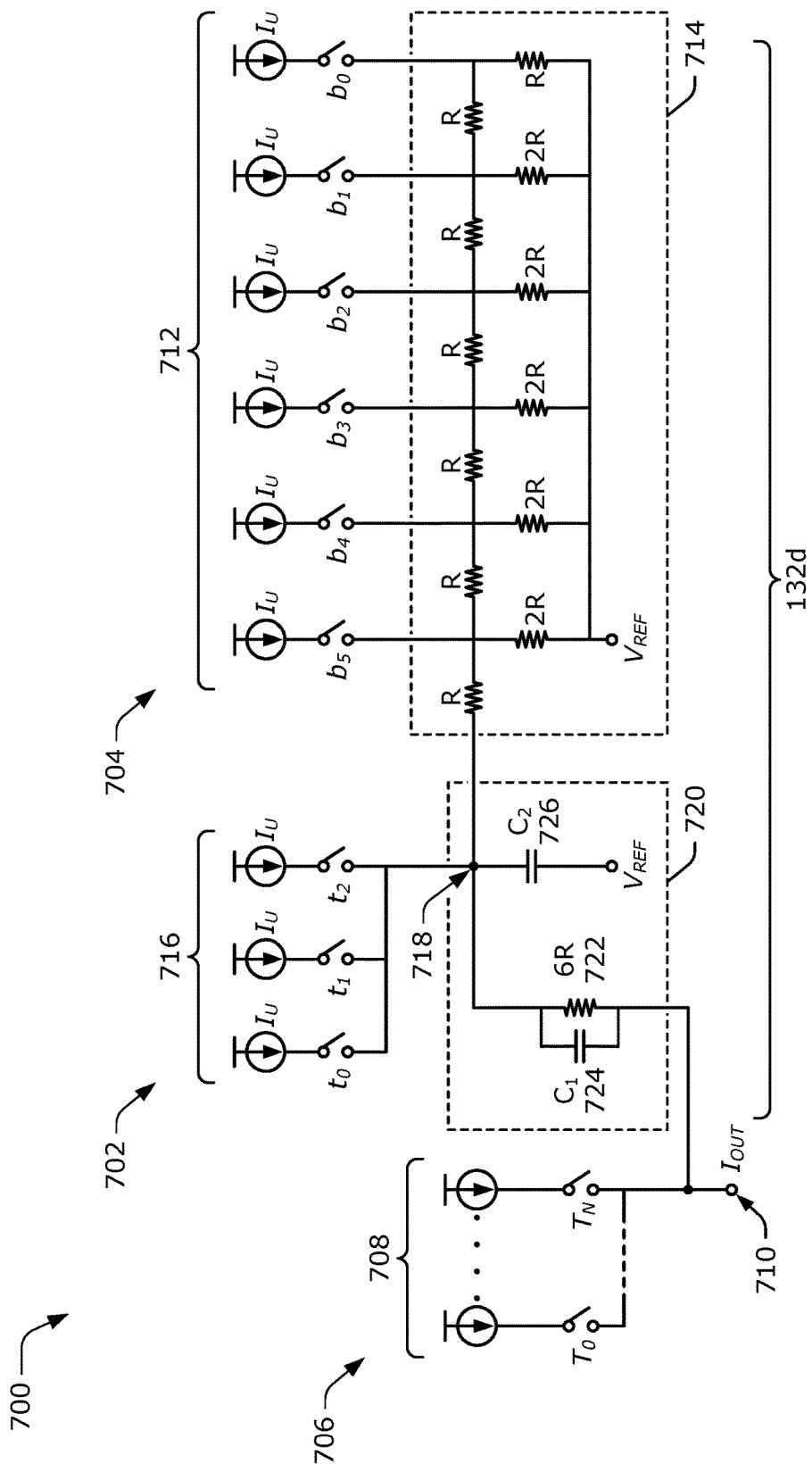
FIG. 7 illustrates an example DAC circuit implemented with segmented resistor architecture in accordance with one or more aspects.

FIG. 7 illustrates an example DAC circuit 700 implemented with segmented resistor architecture in accordance with one or more aspects. The DAC 700 is implemented with a thermometer-coded segment 702 and binary-coded segment 704, which are coupled to a segmented resistor network 132c. In this example, the DAC circuit 700 is shown as a single-ended circuit, though the DAC circuit 700 may be implemented as a differential DAC circuit, such as those described with respect to FIGS. 3 and 4. For visual brevity, decode logic that controls the current-steering switches of the DAC circuit 700 has been omitted, though examples of which are described throughout this disclosure. The DAC circuit 700 includes an MSB segment 706 of current sources 708 (e.g., current source array) having respective outputs coupled to an output 710 of the DAC circuit 700. The respective segments of the DAC circuit 700 may include any suitable number of current sources that are configured to provide a unit of current ($I_U$), which may be referenced to an MSB unit of current ($I_{MSB}$) or an LSB unit of current ($I_{LSB}$). The current sources or switch elements of the DAC circuit 700 may be implemented similar to, or differently from, those described in the disclosure, such as with P-FET or N-FET devices.

In this example, the current sources 708 of the MSB segment 706 are implemented as thermometer code-controlled current sources and are configured to steer current to the output 710 of the DAC circuit 700 based on thermometer-coded bits ($T_0$-$T_N$), where N is any suitable integer. The thermometer-coded segment 702 and a binary-coded segment 704 of the DAC 700 are configured to provide current to the output 710 through the segmented resistor network 132d. Here, respective current sources 712 of the binary-coded segment 704 are coupled to taps of a first resistor network 714 (e.g., an R2R resistor ladder) of the segmented resistor network 132d. The current sources 712 of the binary-coded segment 704 are implemented as binary code-controlled current sources and configured to steer current into the first resistor network 714 based on binary-coded bits ($b_0$-$b_5$), which can be provided from any suitable decode logic.

Current sources 716 of the thermometer-coded segment 702 are coupled to a node 718 of a second resistor network 720 of the segmented resistor network 132d. The current sources 716 of the thermometer-coded segment 702 are implemented as three thermometer code-controlled current sources or as an array of thermometer code-controlled current sources. Although not shown, the DAC circuit 700 may include decode logic for converting two binary input bits ($b_7$ and $b_6$) to three thermometer-coded bits ($t_0$-$t_2$) to control the current sources 716. As such, the current sources 716 steer current into the node 718 of the second resistor network based on the thermometer-coded bits ($t_0$-$t_2$). The second resistor network 720 includes a resistor 722 coupled between the node 718 and the output 710 of the DAC circuit 700. In this example, the DAC circuit 700 also includes a first capacitor 724 ($C_1$ 724) coupled in parallel with the resistor 722 and a second capacitor 726 ($C_2$ 726) coupled between the node 718 and a reference voltage. Respective values of the first and second capacitors 724, 726 may be tuned or adjusted to optimize performance of the DAC circuit 700 for process variations or operating environments. In aspects of segmented resistor architecture, a DAC circuit may be implemented with fewer tuning capacitors (e.g., two bandwidth-tuning capacitors), which can reduce design complexity and enable easier design optimization versus a traditional DAC circuit with more tuning capacitors. The capacitors of the DAC circuit 700 may also compensate for parasitic capacitance of the segmented resistor architecture or improve resistor network impedance ratio accuracy. Depending on various design requirements for a DAC circuit, parameters of the segmented resistor architecture (e.g., binary/thermometer segmentation or number of unit current sources) can be selected to optimize or balance power dissipation, output impedance (and noise of the R2R network), power consumption, resistor network segmentation complexity, and/or total semiconductor area occupied by the current sources, resistors, capacitors, and switch devices (e.g., P-FETs).

Generally, the current injected into the node 718 by the current sources 716 is scaled based on a resistance value of the resistor 722 and an output impedance of the first resistor network 714. In this example, a resistance value of the first resistor 722 is six times (6R) a resistance value of a series resistor (R) of the first resistor network 714. Accordingly, the current provided by the current sources 716 may be scaled such that each of the current sources 716 provides approximately one quarter of a unit of current to the output 710 of the DAC circuit 700. This also provides for a segmented resistor network 132*d* with an output impedance (e.g., approximately 7R) that is higher than that of a typical resistor network of a DAC circuit (e.g., approximately R). As such, the increased output impedance of the first and second resistor networks 714, 720 is effective to reduce an amount of noise (e.g., thermal noise) that transfers from the resistor networks of the segmented resistor architecture to the output of the DAC circuit 700.

Figure 8:
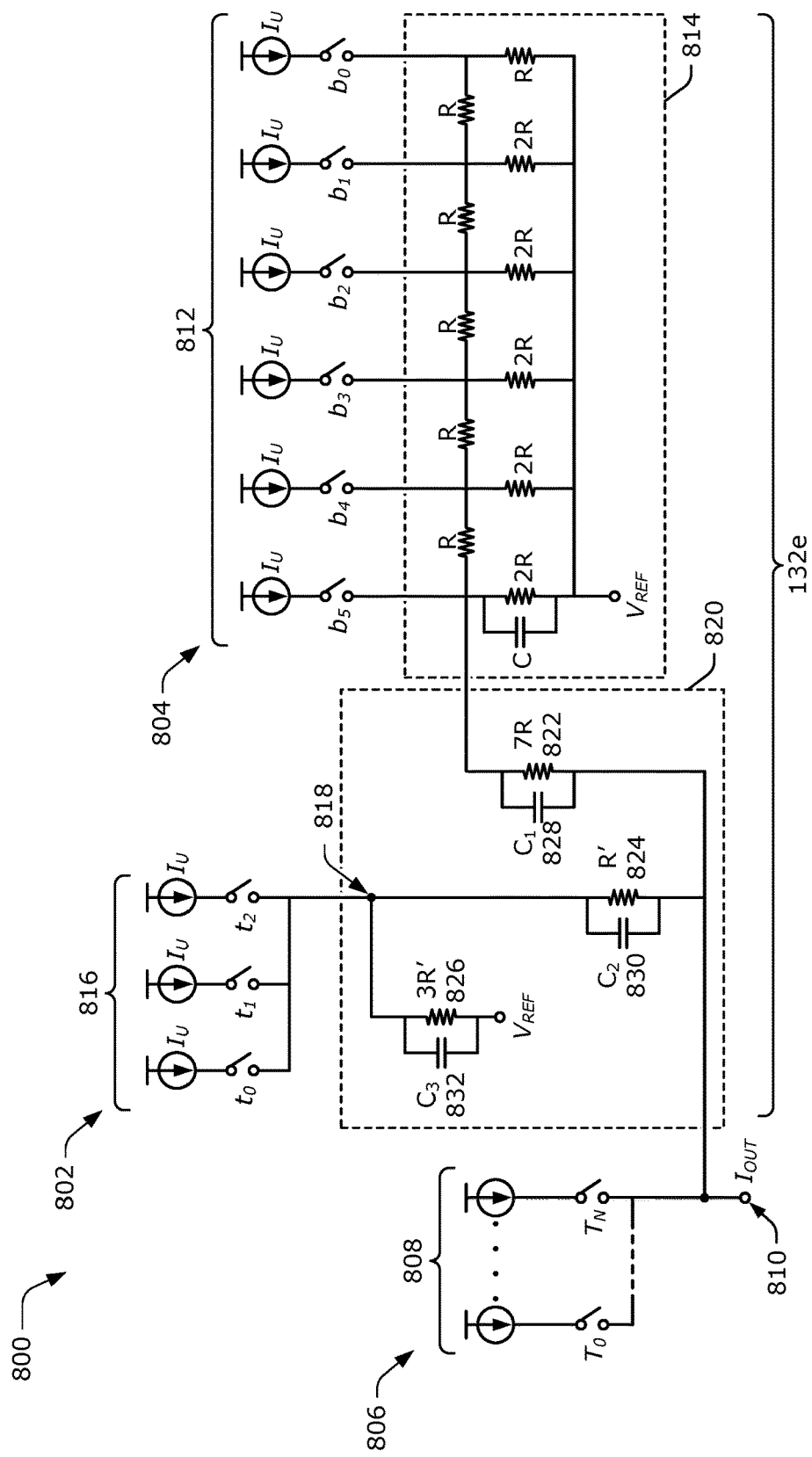
FIG. 8 illustrates another example DAC circuit implemented with segmented resistor architecture in accordance with one or more aspects.

FIG. 8 illustrates another example DAC circuit implemented with segmented resistor architecture in accordance with one or more aspects. The DAC 800 is implemented with a thermometer-coded segment 802 and binary-coded segment 804, which are coupled to a segmented resistor network 132*e*. In this example, the DAC circuit 800 is shown as a single-ended circuit, though the DAC circuit 800 may be implemented as a differential DAC circuit, such as those described with respect to FIGS. 3 and 4. For visual brevity, decode logic that controls the current-steering switches of the DAC circuit 800 has been omitted, though examples of which are described throughout this disclosure. The DAC circuit 800 includes an MSB segment 806 of current sources 808 (e.g., current source array) having respective outputs coupled to an output 810 of the DAC circuit 800. The respective segments of the DAC circuit 800 may include any suitable number of current sources that are configured to provide a unit of current ($I_U$), which may be referenced to an MSB unit of current ($I_{MSB}$) or an LSB unit of current ($I_{LSB}$). The current sources or switch elements of the DAC circuit 800 may be implemented similar to, or differently from, those described in the disclosure, such as with P-FET or N-FET devices.

In this example, the current sources 808 of the MSB segment 806 are implemented as thermometer code-controlled current sources and are configured to steer current to the output 810 of the DAC circuit 800 based on thermometer-coded bits ($T_0$-$T_N$), where N is any suitable integer. The thermometer-coded segment 802 and a binary-coded segment 804 of the DAC 800 are configured to provide current to the output 810 through the segmented resistor network 132*e*. In this example, respective current sources 812 of the binary-coded segment 804 are coupled to taps of a first resistor network 814 (e.g., an R2R resistor ladder) of the segmented resistor network 132*e*. In some cases, the first resistor network includes one or more capacitors (e.g., bandwidth-tuning capacitors) connected in parallel with a respective resistor as shown in FIG. 8 or to a reference voltage, such as to optimize DAC performance. The current sources 812 of the binary-coded segment 804 are implemented as binary code-controlled current sources and configured to steer current into the first resistor network 814 based on binary-coded bits ($b_0$-$b_5$), which can be provided from any suitable decode logic.

Current sources 816 of the thermometer-coded segment 802 are coupled to a node 818 of a second resistor network 820 of the segmented resistor network 132*e*. The current sources 816 of the thermometer-coded segment 802 are implemented as three thermometer code-controlled current sources or as an array of thermometer code-controlled current sources. Although not shown, the DAC circuit 800 may include decode logic for converting two binary input bits ($b_7$ and $b_6$) to three thermometer-coded bits ($t_0$-$t_2$) to control the current sources 816. As such, the current sources 816 steer current into the node 818 of the second resistor network 820 based on the thermometer-coded bits ($t_0$-$t_2$). The second resistor network 820 includes a first resistor 822 coupled between the first resistor network 814 and the output 810 of the DAC circuit 800. For example, a first terminal of the first resistor 822 can be coupled to an output of the first resistor network 814 and a second terminal of the first resistor can be coupled to the output 810 of the DAC circuit 800. The DAC circuit 800 also includes a second resistor 824 coupled between the node 818 of the second resistor network 820 and the output 810 of the DAC circuit 800 (or the second terminal of the first resistor 822).

A third resistor of the second resistor network 820 is coupled between the node 818 and a reference voltage, such as to provide a dump path for current of the current sources 816. The second resistor network 820 also includes a first capacitor 828 ($C_1$ 828), a second capacitor 830 ($C_2$ 830), and a third capacitor 832 ($C_3$ 832) coupled in parallel with the first, second, and third resistors 822, 824, and 826, respectively. Respective values of the first, second, and third capacitors 828, 830, and/or 832 may be tuned or adjusted to optimize performance of the DAC circuit 800 for process variations or operating environments. In aspects of segmented resistor architecture, a DAC circuit may be implemented with fewer tuning capacitors (e.g., three bandwidth-tuning capacitors), which can reduce design complexity and enable easier design optimization versus a traditional DAC circuit with more tuning capacitors. The capacitors of the DAC circuit 600 may also compensate for parasitic capacitance of the segmented resistor architecture or improve resistor network impedance ratio accuracy. Depending on various design requirements for a DAC circuit, parameters of the segmented resistor architecture (e.g., binary/thermometer segmentation or number of unit current sources) can be selected to optimize or balance power dissipation, output impedance (and noise of the R2R network), power consumption, resistor network segmentation complexity, and/or total semiconductor area occupied by the current sources, resistors, capacitors, and switch devices (e.g., P-FETs).

Generally, the current injected into the node 818 by the current sources 816 is scaled based on a resistance value of the resistor 822 and an output impedance of the first resistor network 814. In this example, a resistance value of the first resistor 822 is seven times (7R) a resistance value of a series resistor (R) of the first resistor network 814. Additionally, a resistance of the second resistor 824 may be R' and a resistance of the third resistor 826 may be three times R' (3R'). Accordingly, the current provided by the current sources 816 may be scaled such that each of the current sources 816 provides approximately one quarter of a unit of current to the output 810 of the DAC circuit 800. This also provides for a segmented resistor network 132*e* with an output impedance (e.g., approximately 8R) that is higher than that of a typical resistor network of a DAC circuit (e.g., approximately R). As such, the increased output impedance of the first and second resistor networks 814, 820 is effective to reduce an amount of noise (e.g., thermal noise) that transfers from the resistor networks of the segmented resistor architecture to the output of the DAC circuit 800.

Techniques for DACs with Segmented Resistor Architecture

The following techniques for DACs with segmented resistor architecture may be implemented using any elements of the example environment, components, or circuits described herein. Reference to elements, such as the DAC 130 or segmented resistor network 132 (e.g., any or all of segmented resistor networks 132*a*-132*e*), is made by example only and is not intended to limit the ways in which the techniques can be implemented.

The techniques are described with reference to example methods illustrated in FIGS. 9-11, which are depicted as respective sets of operations or acts that may be performed by entities described herein. The operations described may be performed using any suitable circuitry or component, which may provide means for implementing one or more of the operations. The depicted sets of operations illustrate a few of the many ways in which techniques for DACs with segmented resistor architecture may be implemented. As such, operations of a method may be repeated, combined, separated, omitted, performed in alternate orders, performed concurrently, or used in conjunction with another method or operations thereof.

Figure 9:
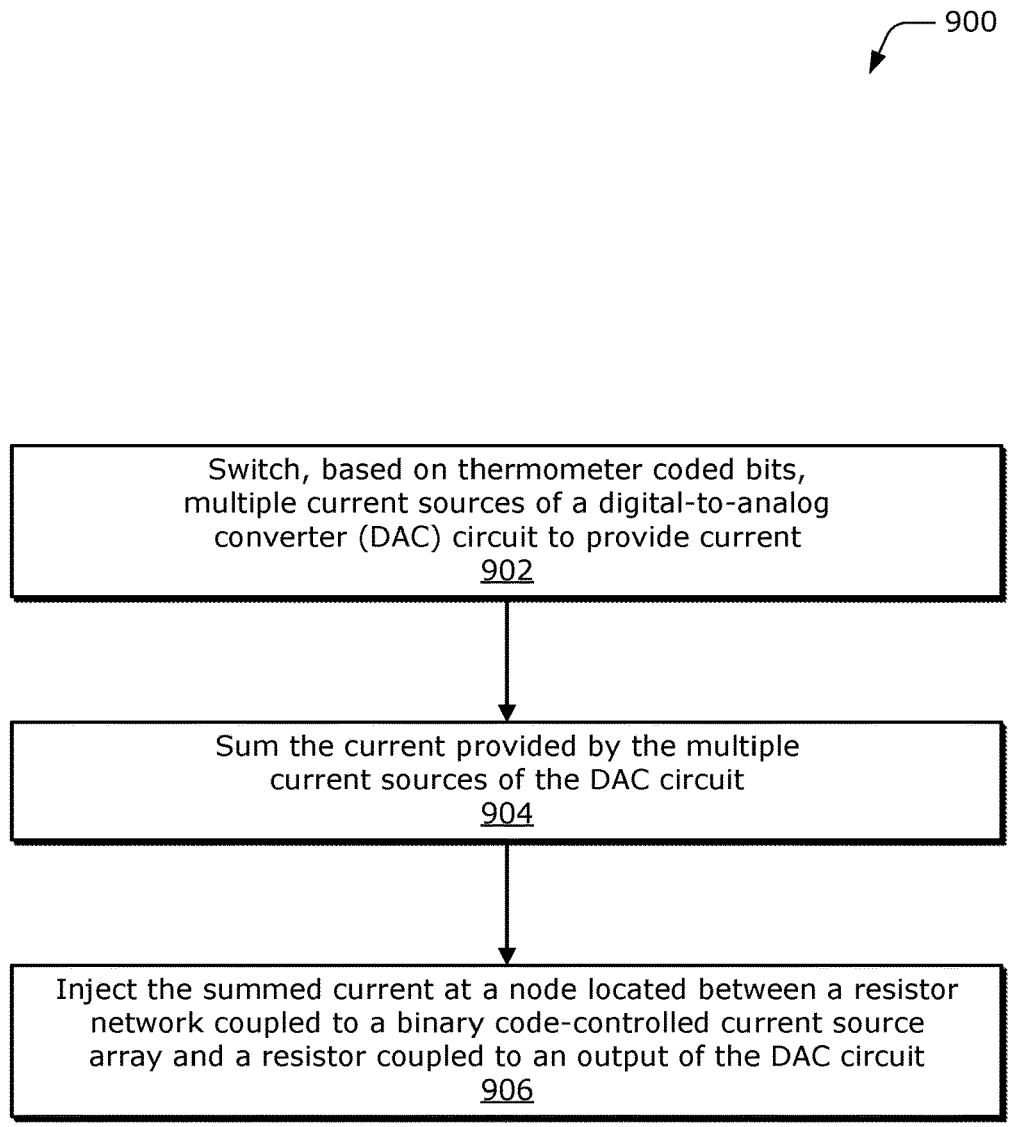
FIG. 9 illustrates an example method for injecting current provided by thermometer code-controlled current sources into a resistor network.

FIG. 9 illustrates an example method 900 for injecting current provided by thermometer code-controlled current sources into a resistor network, including operations performed with the segmented resistor network 132.

At 902, multiple current sources of a DAC circuit are switched based on thermometer-coded bits. For example, decode logic of the DAC circuit can switch multiple current sources of the DAC circuit based on thermometer-coded bits. The DAC circuit also includes a first resistor network coupled to current sources controlled by binary-coded bits. The multiple current sources provide, based on the thermometer-coded bits, current to a common current branch or rail to which respective outputs of the current sources are coupled. The decode logic may also decode a set of binary-coded bits that are provided to the DAC circuit as a digital input to generate the thermometer-coded bits. In some cases, the multiple current sources are current sources of a thermometer-coded segment of a DAC circuit implemented with segmented resistor architecture. The digital input value of the DAC circuit may be received in any suitable size, bit-width, or format, such as an 8-bit digital value to 20-bit digital value.

By way of example, consider the DAC 600 of FIG. 6, which is configured as a 14-bit DAC with a thermometer-coded segment 602 (e.g., a thermometer-coded LSB segment) having seven current sources and a binary-coded segment 604 (e.g., a binary-coded LSB segment) having five current sources. Provided with an 8-bit binary-coded LSB input value, decode logic 622 of the DAC circuit converts binary-coded bits ($b_7$-$b_5$) to seven thermometer-coded bits ($t_0$-$t_6$) to control the current sources 616. To do so, the decode logic 622 applies bit values or control signals to respective switches coupled between the current sources 616 and the node 618 of the DAC circuit. Based on connections of the switches (e.g., ON/OFF switch states), the current sources 616 provide current to a common rail or current branch that is coupled to the node 618.

At 904, current provided by the multiple current sources is summed. For example, a common rail to which the current sources are coupled can sum the current that is provided based on the thermometer-coded bits. The common rail or current branch may be coupled to, or form, a node of the second resistor network, such as an current input of the second resistor network. This node in turn is coupled to an output of the DAC circuit via a resistor that has a resistance value that is higher than a resistance value of the first resistor network or resistors thereof. In some cases, the resistor is also coupled between an output of the first resistor network and the output of the DAC circuit. In the context of the present example referencing FIG. 6, the common rail coupled between the current sources 616 and the node 618 sums the current provided by the current sources 616 based on the thermometer-coded bits.

At 906, the summed current is injected into a node located between a resistor network coupled to binary code-controlled current sources and a resistor coupled to the output of the DAC circuit. In some cases, the common rail of the thermometer-coded current sources injects the summed current into a node located between the first resistor network and a resistor coupled to an output of the DAC circuit. The first resistor network may provide current from binary-coded current sources, such as binary-coded LSB array of current sources. In some cases, the summed current injected into the node is combined with the current provided through the first resistor network. This combined current may include a portion of a unit of current that is then transferred or passed to the output of the DAC circuit through a second resistor network or the resistor coupled to the node, which may be part of the second resistor network. Concluding the present and with reference to the DAC 600, the summed current provided by the current sources 616 based on the thermometer-coded bits is injected into the node 618 of the second resistor network 620. The summed current is then combined with the current provided through the first resistor network 614, and the combined current is then transmitted to the output 610 of the DAC circuit 600 through the resistor 624.

Figure 10:
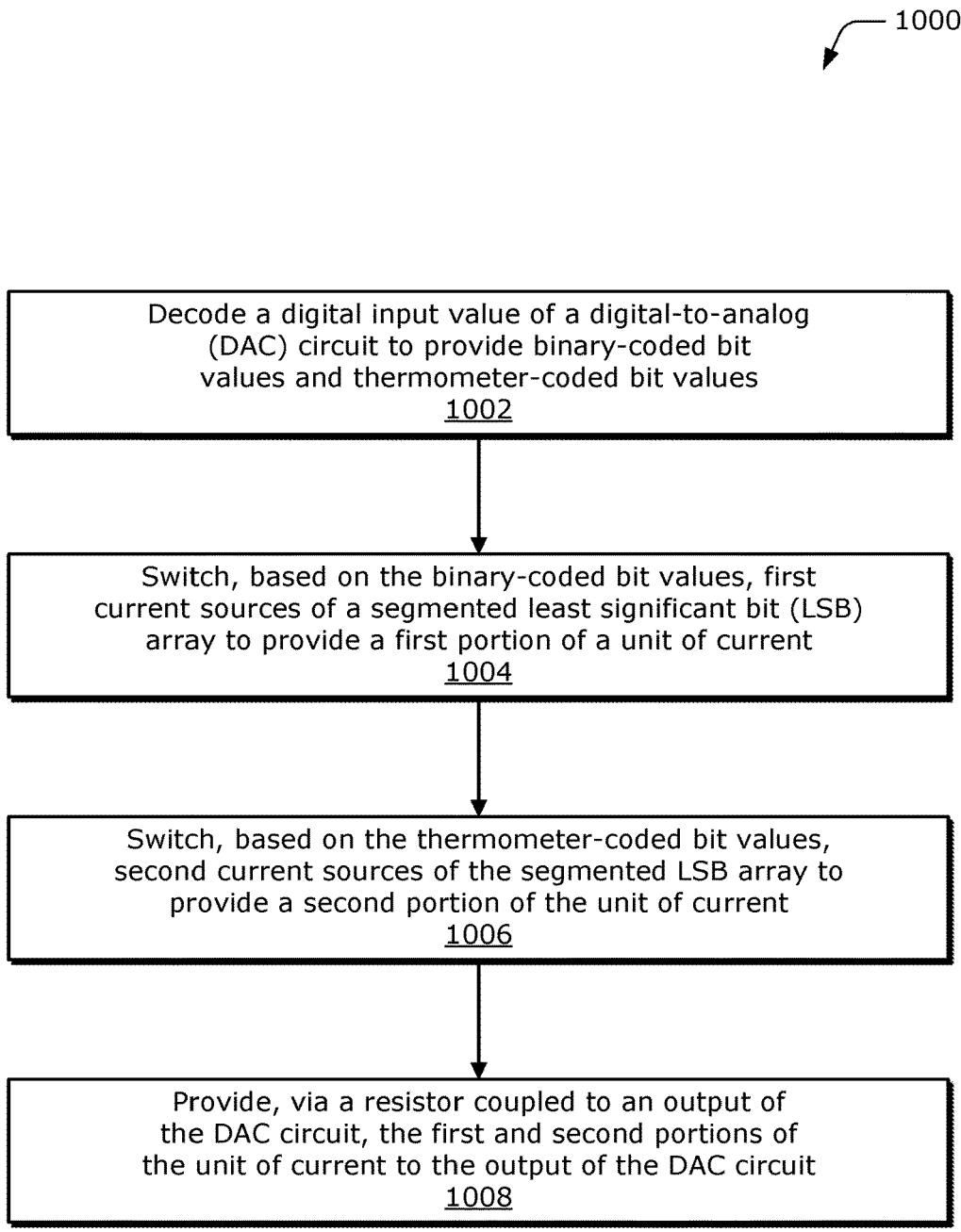
FIG. 10 illustrates an example method for providing a portion of a unit of current ($I_U$) based on binary-coded bit values and thermometer-coded bit values.

FIG. 10 illustrates an example method 1000 for providing a portion of a unit of current based on binary-coded bit values and thermometer-coded bit values, including operations performed with decode logic 320, decode logic 622, and/or a segmented resistor network 132.

At 1002, a digital input value of a DAC circuit is decoded to provide binary-coded bits and thermometer-coded bits. For example, decode logic of a DAC circuit may decode a digital input value of the DAC circuit to provide the thermometer-coded bit values and the binary-coded bit values. The digital input value may include a set of binary-coded bits with any suitable bit-width, such as a 12-bit to 14-bit input value. At least two bits of the digital input value are decoded or converted from binary format to thermometer coding or unary coding. For example, two binary-coded bits can be converted to three thermometer-coded bits, three binary-coded bits can be converted to seven thermometer-coded bits, four binary-code bits can be converted to 15 thermometer-coded bits, and so on.

At 1004, first current sources of a segmented LSB array are switched based on the binary-coded bits to provide a first portion of a unit of current. The segmented LSB array may include an array of binary code-controlled current sources and an array of thermometer code-controlled current sources. For example, the decode logic of the DAC circuit can switch first current sources (e.g., binary code-controlled current sources) of the segmented LSB array to provide the first portion of a unit of current. The decode logic switches the first current sources of the segmented LSB array based on the binary-coded bits. Generally, the decode logic switches the first current sources by activating one of two switch devices that are coupled to an output of a current source to steer the current between a positive or negative section of the DAC. Here, the first portion of the unit of current is provided through a first resistor network of the DAC, to which the first current sources are coupled. The first resistor network of the DAC may be configured as a resistor ladder or a resistor-2resistor ladder.

At 1006, second current sources of the segmented LSB array are switched based on the thermometer-coded bits to provide a second portion of the unit of current. In some cases, the decode logic of the DAC circuit switches second current sources (e.g., thermometer code-controlled current sources) of the segmented LSB array to provide the second portion of the unit of current. The decode logic switches the second current sources are switched based on the binary-coded bits. Generally, the decode logic switches the second current sources by activating one of two switch devices that are coupled to an output of a current source to steer the current between a positive or negative section of the DAC. Here, the current sources may be activated to provide current to a common rail or current branch by which current is provided to a node located that is between the first resistor network and a resistor coupled to an output of the DAC circuit. In some cases, the node is part of a second resistor network of a segmented resistor network of the DAC through which current is provided to the output of the DAC.

At 1008, the first portion and the second portion of the unit of current are provided to the output of the DAC. For example, the second resistor network can provide the first portion and the second portion of the unit of current to the output of the DAC. In some cases, the first portion and the second portion of the unit of current are provided via a resistor of the second resistor network that is coupled between the node and the output of the DAC. The first and second portions of the unit of current may be combined with MSB current of the DAC to provide output current for the DAC (e.g., up to full-scale current). A resistance of the resistor coupled to the output of the DAC is higher than a resistance of the first resistor network (e.g., R2R ladder) such that an output impedance of the segmented resistor network is higher than that of a conventional DAC resistor network. This in turn reduces an amount of thermal current noise that transfers to the output of the DAC with the output current.

Figure 11:
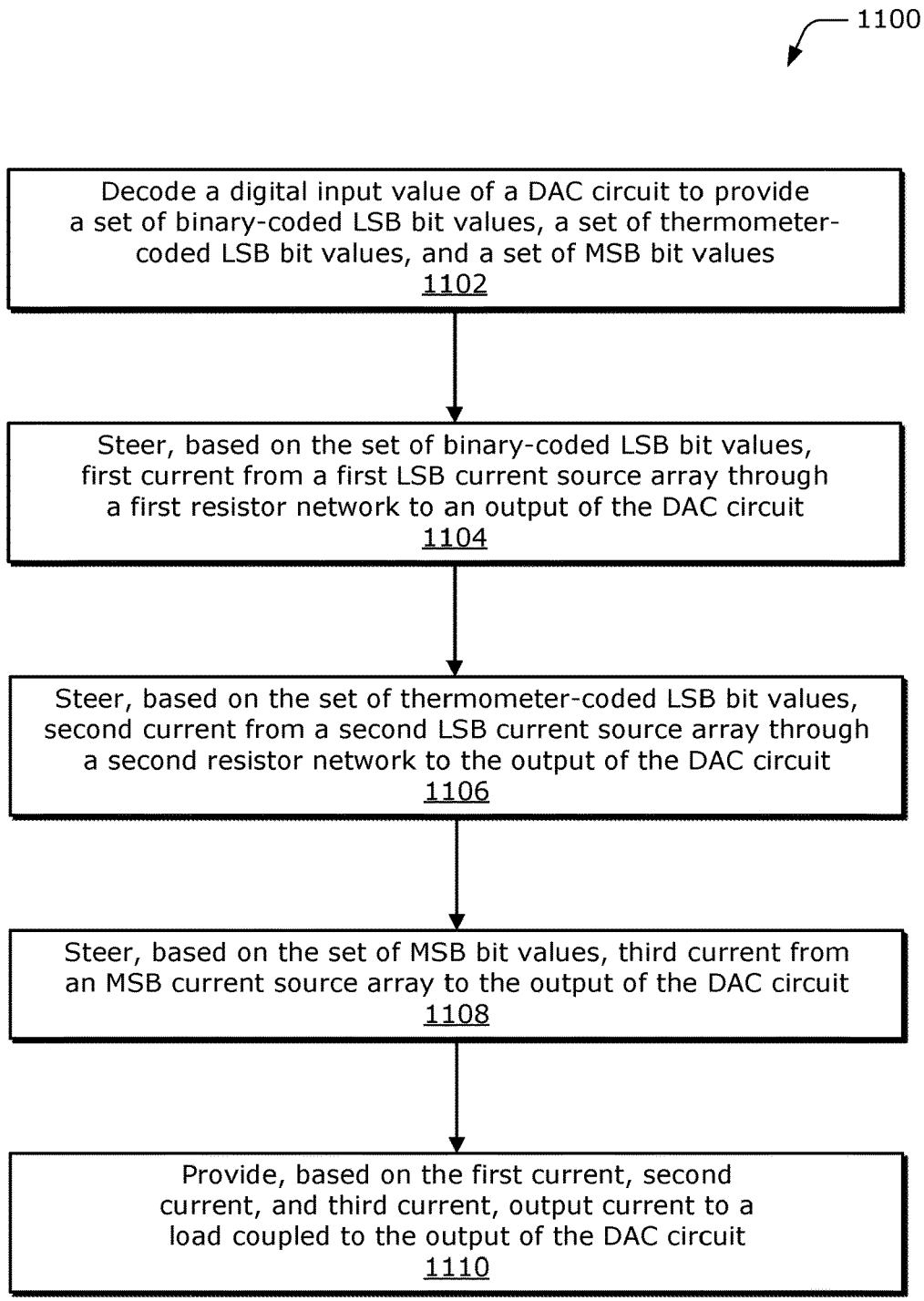
FIG. 11 illustrates an example method for steering current of a segmented LSB array based on respective sets of binary-coded and thermometer-coded bit values.

FIG. 11 illustrates an example method 1100 for steering current of a segmented LSB array based on respective sets of binary-coded and thermometer-coded bit values, including operations performed with a segmented resistor network 132.

At 1102, a digital input value of a DAC circuit is decoded to provide a set of binary-coded LSB bit values, a set of thermometer-coded LSB bit values, and a set of MSB bit values. In some cases, decode logic of a DAC circuit decodes a digital input value of the DAC circuit to provide the set of binary-coded LSB bit values, the set of thermometer-coded LSB bit values, and the set of MSB bit values. The set of MSB may be thermometer-coded bits for controlling an MSB current source array of the DAC circuit. The set of thermometer-coded LSB bit values may be provided by decoding or converting a portion of the digital input value that is coded in a binary format. For example, three binary-coded bit values of the digital input value may be converted to seven thermometer-coded bit values. The set of thermometer-coded LSB bit values may include any suitable number of bit values, such from three thermometer-coded bit values to 15 thermometer-coded bit values.

At 1104, first current is steered, based on the binary-coded LSB bit values, from a first LSB current source array through a first resistor network of the DAC circuit. The first current is steered through the first resistor network to an output of the DAC circuit. In some cases, the decode logic of the DAC circuit steers, based on the binary-coded LSB bit values, first current from a first LSB current source array through a first resistor network. The first current can be steered toward the output of the DAC circuit, such as through another resistor or a second resistor network of the DAC circuit. The first resistor network may be configured as an R2R ladder through which the first current is provided to the second resistor network of the DAC circuit. In some cases, the second current is provided to a node of the second resistor network that is coupled to the output of the DAC circuit via a resistor. In such cases, a resistance of the resistor is higher than an effective resistance of the first resistor network.

At 1106, second current is steered, based on the thermometer-coded LSB bit values, from a second LSB current source array through a second resistor network of the DAC circuit. The second current is steered through the second resistor network to the output of the DAC circuit. For example, the decode logic of the DAC circuit can steer, based on the thermometer-coded LSB bit values, second current from a second LSB current source array through a second resistor network to the output of the DAC circuit. The second current of the second LSB array is injected into a node of the second resistor network. In some cases, the node of the second resistor network is coupled to an output of the DAC circuit via a resistor. In such cases, the first current and second current can be provided to the output of the DAC circuit through the resistor. This resistor may have a resistance value that is higher than that of the first resistor network, which can be effective to prevent noise from transferring to the output of the DAC circuit.

At 1108, third current is steered, based on the set of MSB bit values, from an MSB current source array to the output of the DAC circuit. In some cases, the decode logic of the DAC circuit steers the third current from the MSB current source array to the output of the DAC circuit. Generally, the decode logic steers the third current from the MSB current source array by activating one of two switches coupled to an output of an MSB current source to steer the current between a positive or negative output leg of the DAC circuit. This may include applying control signal or bit values to gates of the switches or switch devices. In some cases, the MSB current source array is coupled directly to the output of the DAC circuit via the respective switches.

At 1110, output current is provided to the output of the DAC circuit based on the first current, the second current, and the third current. The output current is provided to a load coupled to the output of the DAC circuit, such as a filter or mixer. For example, the output of the DAC circuit can provide output current to the load connected to the output based on the first current, the second current, and the third current. In some cases, the third current is provided directly from the MSB current source array to the output of the DAC circuit. This third current, which may include multiple units of current, is combined with the second current and third current provided by the respective LSB segments of the DAC circuit. The second current and third current may include fractions or portions of a unit of current, and/or may be referred to as LSB current. Because the second current and the third currents are provided through the resistor of the second resistor network that has a higher resistance than a typical DAC resistor network, less thermal noise current is able to transfer to the output of the DAC with the LSB portion of the DAC current.

Figure 12:
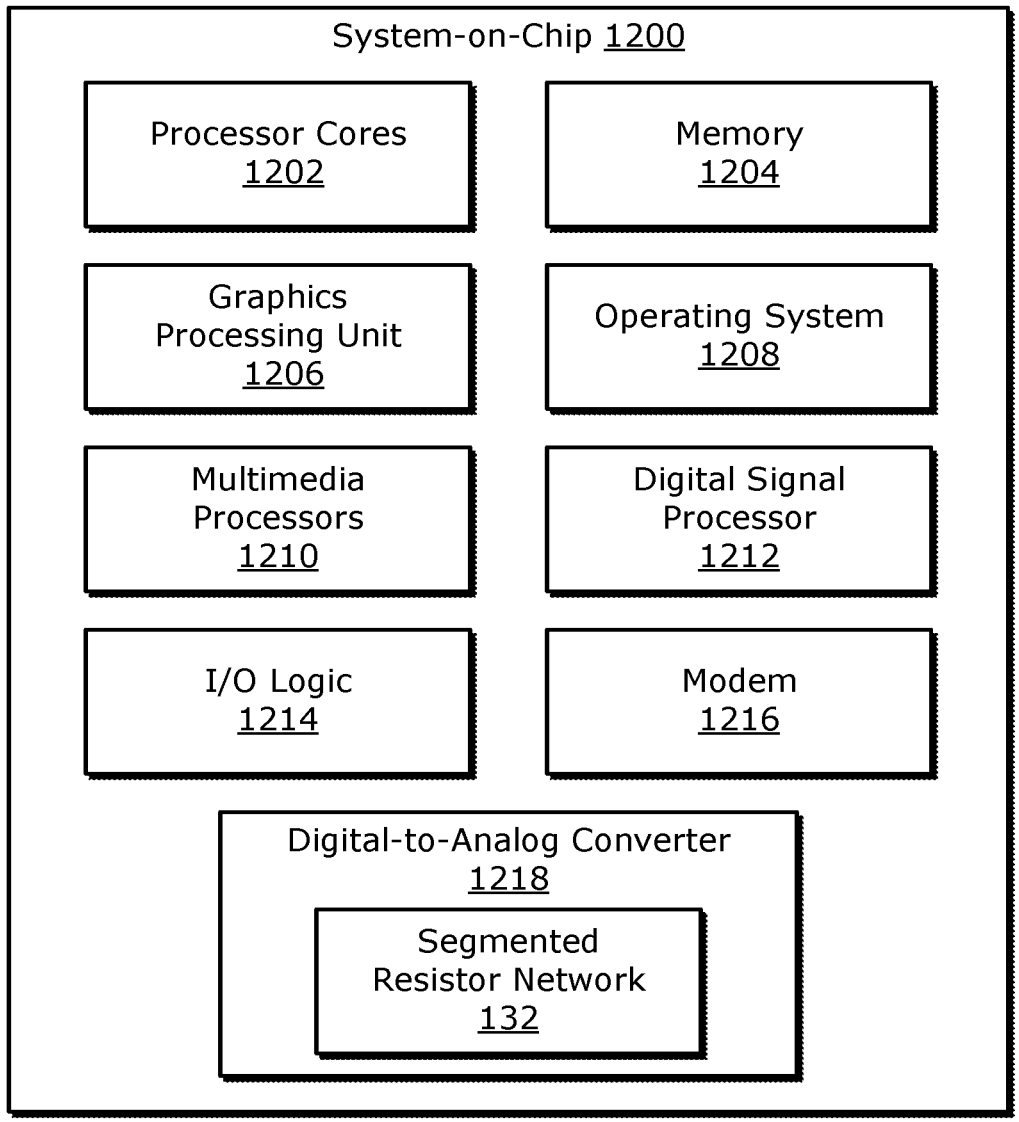
FIG. 12 illustrates an example system-on-chip that includes a digital-to-analog converter implemented with a segmented resistor architecture.

FIG. 12 illustrates an example system-on-chip 1200, which includes components in which aspects of segmented resistor architecture for DACs can be implemented. The system-on-chip 1200 may be implemented in, or part of, any suitable electronic device, such as a modem, broadband router, access point, cellular phone, smart-phone, gaming device, set-top box, laptop computer, net book, smart-phone, network-attached storage (NAS) device, IoT device, or any other device that may include DACs with segmented resistor networks.

The system-on-chip 1200 may be implemented with a microprocessor, memory, I/O logic, data interfaces, communication module, image processor, audio processor, security module, circuitry, firmware, software, or combinations thereof to provide communicative or processing functionalities. The system-on-chip 1200 may include a data bus (e.g., cross bar or interconnect fabric) enabling communication between the various components of the system-on-chip or external components coupled to the system-on-chip (e.g., off-chip memory or transceivers). In some aspects, components of the system-on-chip 1200 may interact with other communication components or audio components that use or include a DAC circuit with segmented resistor architecture.

In this particular example, the system-on-chip 1200 includes processor cores 1202, memory 1204, and graphics processing unit 1206. The processor cores 1202 may be configured as any suitable type of processor, such as an application processor with homogenous or heterogeneous core architecture. The memory 1204 may include any suitable type of memory, such as volatile memory (e.g., DRAM), static RAM (SRAM), non-volatile memory (e.g., Flash), and the like. The memory 1204 or other caches of the system-on-chip 1200 are implemented as a storage medium, and thus do not include transitory propagating signals or carrier waves. The memory 1204 can store data and processor-executable instructions of system-on-chip 1200, such as an operating system 1208, firmware, boot code, or other applications. The processor cores 1202 execute operating system 1208 (or firmware) and other applications from the memory 1204 to implement functions of the system-on-chip 1200.

The GPU 1206 of the system-on-chip 1200 renders graphical content associated with the operating system 1208 and applications to provide various user interfaces or visual graphics. The system-on-chip 1200 may also include multimedia processors 1210 for encoding or decoding multimedia content, such as audio streams or video streams. In some configurations, the system-on-chip 1200 includes an image sensor processor to capture image data provided by an image sensor operably coupled with the system-on-chip 1200. Alternately or additionally, the system-on-chip 1200 can implement a digital signal processor 1212 to process signals and input from other sensors associated with the system-on-chip. For example, a digital signal processor 1212 can be implemented as an audio codec to encode or decode audio data, such as to encode audio signals received from a microphone or provide audio signals to drive a speaker.

As shown in FIG. 12, the system-on-chip 1200 may also include I/O logic 1214 configured to provide a variety of I/O ports or data interfaces for intra-chip or off-chip communication. These data interfaces may include any suitable type of interface or bus, such as an interface to a host device or other peripherals components. Wireless communication of the system-on-chip 1200 is enabled by a modem 1216, which can be configured as a multi-mode and/or multi-band radio to communicate in accordance with multiple communication standards, protocols, or specifications. Although not shown, the system-on-chip can also include a power management component to control power regulation or battery charging circuitry of a device in which the system-on-chip 1200 is implemented.

The system-on-chip 1200 also includes a digital-to-analog converter 1218 (DAC 1218) with an instance of a segmented resistor network 132, which may be implemented as described throughout the disclosure (e.g., any of segmented resistor networks 132*a*-132*e*). Although shown generally as part of the system-on-chip 1200, the DAC 1218 can be implemented in or with any component of the system-on-chip 1200. For example, the DAC 1218 can be implemented with or as part of the digital signal processor 1212, I/O logic 1214, modem 1216 (or communication processor), an audio codec, an A/D-D/A logic block, or another component configured to enable wireless or wired communication.

The DAC 1218 may convert any suitable type of input data, such as modulated baseband information to analog signals prior to up-conversion by a transceiver or transmit chain. As described herein, the segmented resistor network 132 and associated thermometer code-controlled current sources may improve output impedance of the resistor network, which in turn reduces an amount of noise (e.g., thermal noise) that transfers or passes to an output of the DAC 1218. By so doing, the DAC 1218 with segmented resistor network 132 may improve an SNR, SNDR, or RxNB performance of a component in which the DAC 1218 is embodied.

Figure 13:
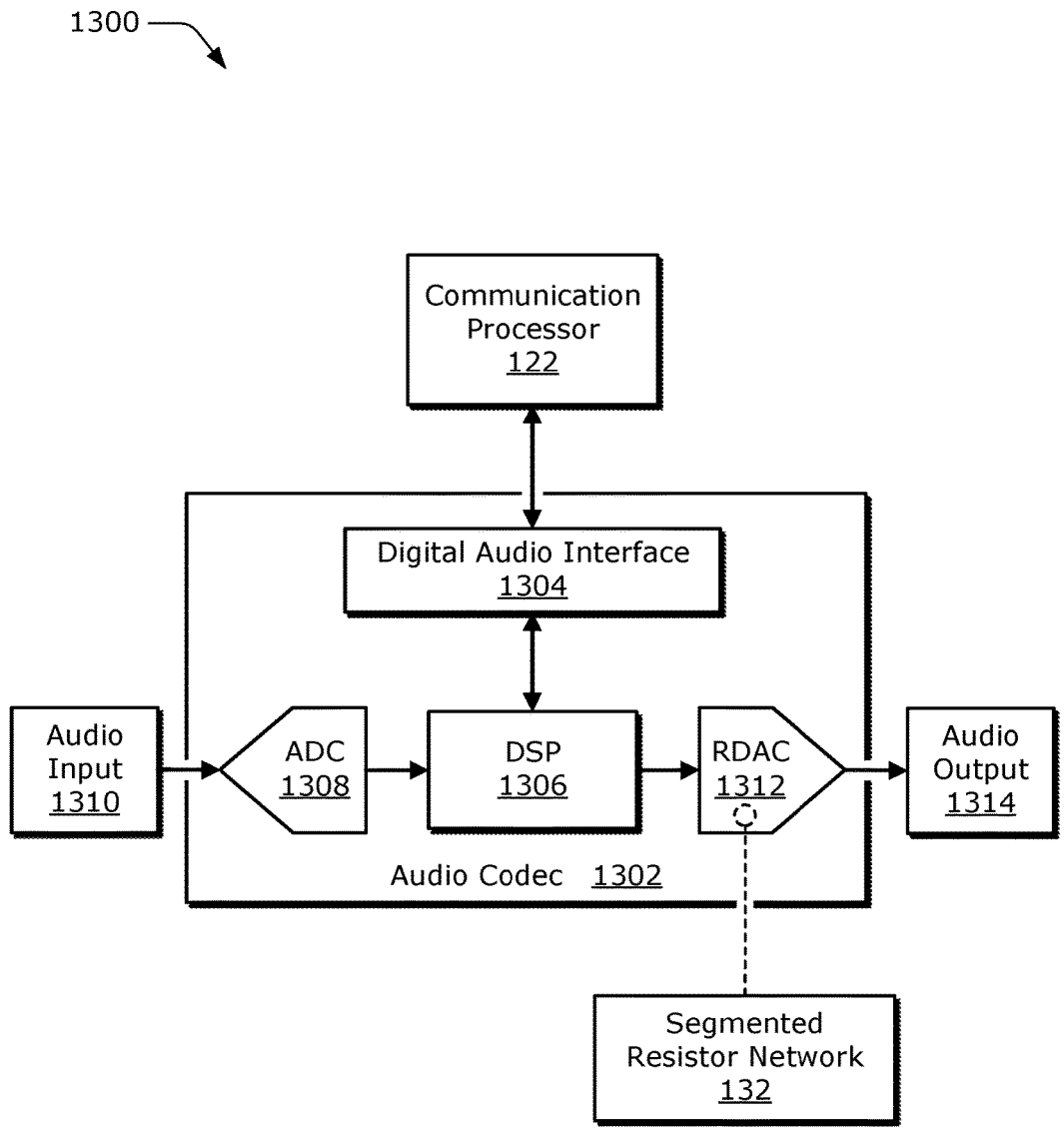
FIG. 13 illustrates an example audio codec that includes a resistive DAC (RDAC) implemented with a segmented resistor architecture.

FIG. 13 illustrates, at 1300, an example audio coder-decoder 1302 (audio codec 1302) in which aspects of segmented resistor architecture for DACs can be implemented. The audio codec 1302 may be implemented as part of any suitable system or device, such as the computing device 102 or system-on-chip 1200. In this example, the audio codec 1302 is shown as being implemented in association with the communication processor 122 of the computing device 102. The audio codec 1302 can be configured to provide audio functionalities for the communication processor 122, such as to encode audio signals received from a microphone or decode audio data for output to a speaker of the computing device 102.

Generally, the audio codec 1302 communicates with and provides audio functionalities of the communication processor 122 through a digital audio interface 1304. The communication processor 122 or another controller (e.g., application processor) may transmit and receive digital information (e.g., digital audio information) with a digital signal processor 1306 (DSP 1306) of the audio codec 1302. The DSP 1306 processes digital signals and other data, such as to provide encoding or decoding capabilities of the audio codec 1302. In some cases, the DSP 1306 is configured to provide various signal conditioning processes that may include signal filtering, gain, decimation, equalization, adaptive predictive coding, compression, interpolation, mixing, or the like. Alternately or additionally, the DSP 1306 of the audio codec 1302 may be implemented with or as part of another DSP component of the computing device 102, the wireless interface 120, processor 108, or system-on-chip 1200 of FIG. 12.

In this example, the audio codec 1302 also includes an analog-to-digital converter 1308 (ADC 1308) to convert analog signals received from an audio input 1310 to a digital representation. Generally, the ADC 1308 may operate as part of an input section of the audio codec 1302 to convert analog signals to a digital format for subsequent processing by the DSP 1306 or use by other components of the computing device 102 or system-on-chip 1200. The ADC 1308 may also be configured to provide digital audio information at any suitable bit resolution, bit depth, dynamic range, or sampling rate. In some cases, the audio input 1310 is coupled with a microphone or microphone array of the computing device 102. Alternately or additionally, the audio input 1310 is accessible or exposed via a pinning of a line connector (e.g., 3.5 mm jack) or multifunction connector (type C USB port) of the computing device 102.

This example of an audio codec 1302 also includes a resistive digital-to-analog converter 1312 (RDAC 1312) to convert a digital input (e.g., digital audio data) an analog signal. Generally, the RDAC 1312 may operate as part of an output section of the audio codec 1302 to convert digital audio information to an analog format for output by an audio output 1314 that is coupled to an output of the audio codec 1302. In some cases, the audio output 1314 include mixers, switches, or amplifiers to provide one or more channels of analog audio output. The audio output 1314 can be coupled to a speaker or speakers embodied in the computing device 102. Alternately or additionally, the audio output 1314 is exposed via a pinning of a line out connector or multifunction connector of the computing device 102 or system-on-chip 1200 for coupling with external speakers or audio components.

In some aspects, the RDAC 1312 of the audio codec 1302 is implemented with a segmented resistor network 132 (e.g., any of segmented resistor networks 132a-132e). In contrast with homogeneous resistor networks or ladders (e.g., a pure R2R LSB array), the segmented resistor network 132 provides a higher output impedance that reduces or limits a transfer of noise (e.g., thermal noise) from the resistor network to an output of the RDAC 1312. As such, the RDAC 1312 or audio codec 1302 may operate with an improved SNR or higher level of output precision.

Figure 14:
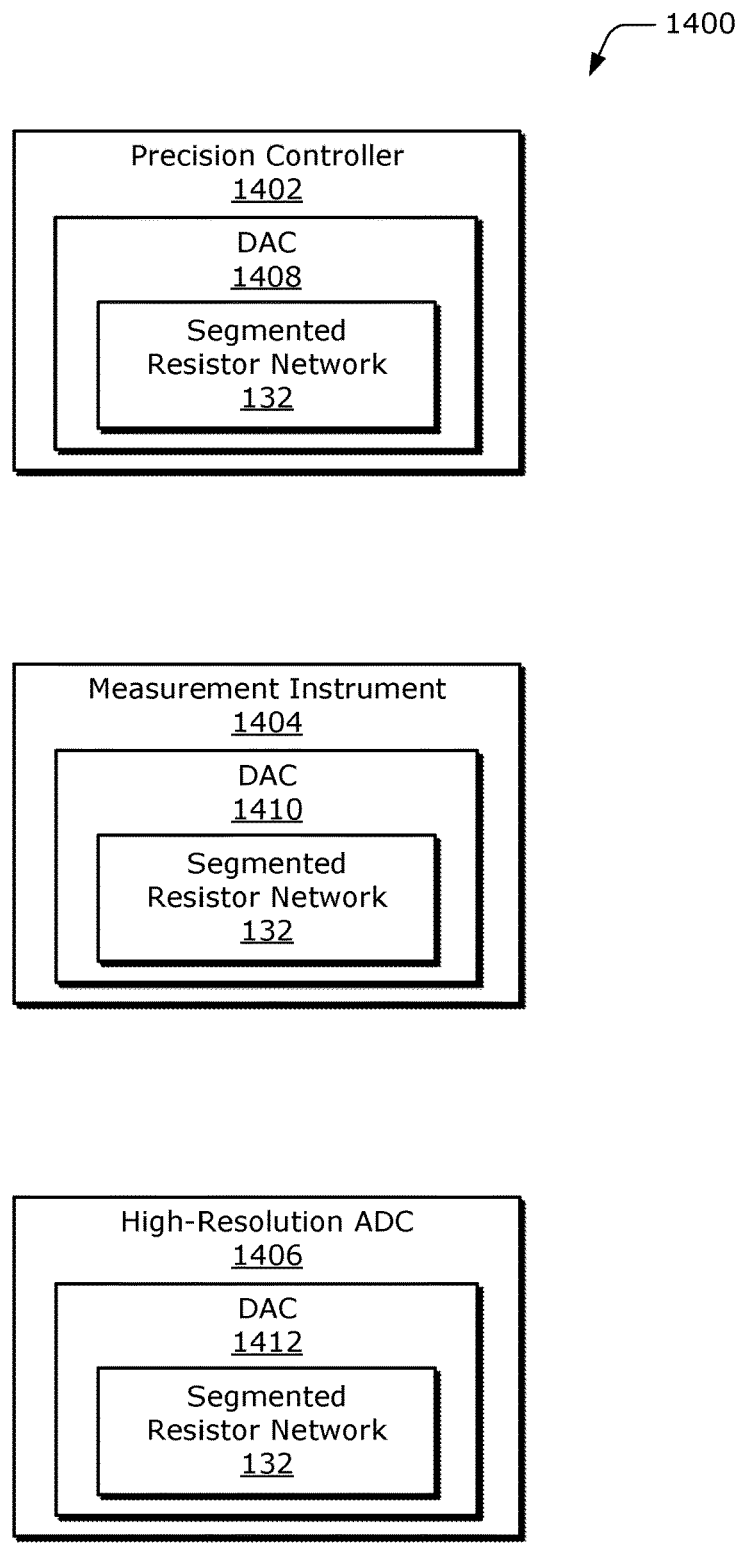
FIG. 14 illustrates examples of a precision controller, measurement instrument, and analog-to-digital converter in which aspects of segmented resistor architecture can be implemented.

FIG. 14 illustrates additional examples of devices in which aspects of segmented resistor architecture for DACs can be implemented. As shown at 1400, the example devices include a precision controller 1402, a measurement instrument 1404, and a high-resolution analog-to-digital converter 1406 (high-resolution ADC 1406). Although referred to as devices, the precision controller 1402, measurement instrument 1404, or high resolution ADC 1406 may be implemented as a respective circuit, assembly, module, block, or component. These devices can also be implemented separately or combined with other entities described herein to provide any suitable type of device or apparatus. Examples of such systems include a motion controller, robotic system, machine vision system, medical instrument, medical device (e.g., implant or sensor), process controller, flight control system, radar system, or the like. Alternately or additionally, any of the example devices 1402, 1404, or 1406 may also be implemented with, or as part of, a computing device 102 of FIG. 1 or system-on-chip 1200 of FIG. 12.

Generally, the precision controller 1402 provides a control signal to control or manage another component, device, or system. The precision controller 1402 may operate as part of an open-loop control system or a closed-loop control system (e.g., self-adjusting). In the case of a closed-loop system, the precision controller 1402 may receive feedback information from sensors associated with components of the system under control. In this example, the precision controller 1402 includes a digital-to-analog converter 1408 (DAC 1408), which generates an analog signal suitable for providing a control signal for output by the precision controller 1402.

In some aspects, the DAC 1408 includes an instance of a segmented resistor network, which as described herein provides greater output impedance than a typical DAC resistor network. This greater output resistance can reduce a level of noise present at an output of the DAC 1408 or a signal provided by the precision controller 1402. As such, the precision controller 1402 may enable improved control of other devices or system components through the use of control signals that have less noise or control signals that are provided with an increased level of precision.

The measurement instrument 1404 is generally configured to measure or quantify physical aspects of a subject or unit under measurement. For example, the measurement instrument 1404 can be implemented to provide a measuring function for a specific field or type of work, such as physical science, biological science, engineering, or quality assurance. To perform such measurements, the measurement instrument 1404 is configured with an analog-to-digital conversion (ADC) circuit (not shown) that includes a digital-to-analog converter 1410 (DAC 1410). For example, the DAC 1410 can be implemented as part of a successive-approximation ADC circuit or sigma-delta ADC circuit of the measurement instrument. Alternately or additionally, the ADC circuit of the measurement instrument 1404 can include other stages, such as a filter stage, decimation stage, and so on.

The DAC 1410 of the measurement instrument 1404 is implemented with a segmented resistor network 132, which may be configured similar to or differently from the segmented resistor networks described herein (e.g., any of segmented resistor networks 132a-132e). The segmented resistor network 132 features an increased output impedance versus a homogenous resistor network. This increased output impedance can reduce an amount of noise that is present at an output of the DAC 1410, which may be effective to improve precision of the DAC 1410. Accordingly, the DAC 1410 with the segmented resistor network 132 improve accuracy, precision, resolution, or sensitivity of the measurement instrument 1404.

Generally, the high-resolution ADC 1406 enables conversion or quantization of analog signals to a discrete-time and discrete-amplitude digital signal. The high-resolution ADC 1406 may sample analog signals at any suitable resolution, such as a range of approximately 8-bit resolution to 20-bit resolution, or more. Alternately or additionally, the high-resolution ADC 1406 can be configured to convert input signals that extend over wide dynamic ranges (e.g., 115-dB signal range). The high-resolution ADC 1406 may be implemented as any suitable type of ADC, such as a successive-approximation ADC or sigma-delta ADC, which includes a DAC 1412. The DAC 1412 is implemented with a segmented resistor network 132 (e.g., any of segmented resistor networks 132a-132e), which features an increased output impedance versus a monolithic resistor network (e.g., pure R2R network). This increased output impedance reduces an amount of noise that transfers from the resistor network to an output of the DAC 1412, which may be effective to improve SNR or resolution of the DAC 1412. As such, the high-resolution ADC 1406 may operate with a higher level of accuracy, precision, or sensitivity than a conventionally implemented ADC.

Various aspects of segmented resistor architecture are described throughout the disclosure, figures, and/or appended claims. These aspects may be implemented independently or in combination with one another, such as described in aspects set forth in examples that follow. These aspects are presented by way of example only, and are not intended to limit the ways in which apparatuses, circuits, components, and/or techniques can be implemented with segmented resistor architecture.

In an example aspect, a digital-to-analog conversion (DAC) circuit is disclosed that comprises a first set of current sources having outputs coupled to an output of the DAC circuit via respective ones of a first set of switches. The DAC circuit also includes a second set of current sources having outputs coupled to respective taps of a resistor network via a second set of switches. A third set of current sources of the DAC circuit have outputs coupled, via respective ones of a third set of switches, to a node located between an output of the resistor network and a first terminal of a resistor that has a second terminal coupled to the output of the circuit.

In some cases, the output of the resistor network is provided via a resistor of the resistor network and a resistance value of the resistor having the second terminal coupled to the output of the circuit is greater than a resistance value of the resistor of the resistor network or an effective resistance of the resistor network. Further, a total resistance between at least the node and the output of the circuit can be greater than the resistance (e.g., at least two times greater) value of the resistor of the resistor network or the effective resistance of the resistor network.

The DAC circuit may also comprise code-converting circuitry that includes an input configured to receive binary-coded bit values. The code-converting circuitry has logic configured to convert the binary-coded bit values to thermometer-coded bit values and an output configured to control individual ones of the third set of switches based on respective values of the thermometer-coded bit values. Alternately or additionally, the DAC circuit may be implemented with decode logic that includes an input configured to receive a digital value and decoding logic configured to decode the digital value into a first set of thermometer-coded bit values, a second set of thermometer-coded bit values, and a set of binary-coded bit values. The DAC circuit may also be implemented with a first output configured to control the first set of switches based on the first set of thermometer-coded bit values, a second output configured to control the second set of switches based on the second set of thermometer-coded bit values, and a third output configured to control the third set of switches based on the binary-coded bit values.

In some cases, the resistor network of the DAC circuit may include resistors that are configured as a resistor-2resistor ladder. The DAC circuit may also comprise a capacitor having a first terminal coupled to the first terminal of the resistor and a second terminal coupled to the second terminal of the resistor. Alternately or additionally, the resistor may comprise a first resistor and the DAC circuit further comprises a second resistor coupled between the node and a reference voltage. The DAC circuit can further comprise a capacitor coupled between the node and a reference voltage. The DAC circuit may be implemented as part of a differential DAC circuit, a current-steering DAC circuit, a transmitter circuit, or an audio coder-decoder circuit.

In another example aspect, a DAC circuit is disclosed that comprises a first resistor network of first resistors coupled in series with each other and second resistors coupled to a reference voltage. Each of the first resistors have a terminal connectable to a respective ones of a first set of current sources and coupled to the reference voltage via one of the second resistors. The DAC circuit also comprises a second resistor network that includes at least a third resistor coupled between the first resistor network and an output of the DAC circuit, the second resistor network having a node connectable to two or more current sources of a second set of current sources. A third set of current sources of the DAC circuit are individually connectable to the output of the DAC circuit.

The node of the second resistor network can be located at a terminal of the third resistor of the second resistor network. The DAC circuit may also further comprise a set of switches coupled between the terminal of the third resistor and the second set of current sources. Each switch of the set of switches is coupled between the terminal of the third resistor and a respective one of the second set of current sources.

In some cases, a resistance value of the third resistor of the second resistor network is greater than a resistance value of one or more of the first resistors of the first resistor network. The second resistor network can further comprise a fourth resistor coupled between the node and a terminal of the third resistor or a fifth resistor coupled between the node and the reference voltage. Alternately or additionally, the DAC circuit can comprise a capacitor coupled in parallel with the fourth resistor or the fifth resistor of the second resistor network.

The second resistor network of the DAC circuit may further comprise a fourth resistor coupled between a terminal of the third resistor of the second resistor network and the reference voltage. In some cases, the DAC circuit includes a capacitor coupled between a terminal of the third resistor of the second resistor network and the reference voltage or a capacitor coupled in parallel with the third resistor of the second resistor network. The DAC circuit may be implemented as part of a differential DAC, a current-steering DAC, a receiver circuit, or an audio coder-decoder circuit.

In an example aspect, a method is disclosed that comprises providing, based on thermometer-coded bits, current via multiple current sources of a DAC circuit. The method includes summing the current provided by the multiple current sources to provide summed current and injecting the summed current at a node of the DAC circuit. The node is located between a resistor network coupled to a binary code-controlled current source array of the DAC circuit and a resistor coupled to an output of the DAC circuit.

In some cases, a first terminal of the resistor is coupled to the output of the DAC circuit, a second terminal of the resistor is coupled to a terminal of another resistor of the resistor network, and the second terminal of the resistor and the terminal of the other resistor are coupled to the node at which the summed current is injected. Alternately or additionally, a resistance value of the resistor is greater than a resistance value of the other resistor of the resistor network or a total resistance value of the resistor and additional resistors disposed between the node and the output of the DAC circuit is greater than the resistance value of the other resistor of the resistor network.

In some cases, the summed current comprises a first current and the multiple current sources comprise a first set of current sources. In such cases, the method may further comprise providing, based on binary-coded bits, a second current via one or more current sources of the binary code-controlled current source array and providing, based on other thermometer-coded bits, a third current via one or more current sources of a second set of current sources that are coupled to the output of the DAC circuit. The method can then provide, at the output of the DAC circuit, an output current than includes a portion of the first current, a portion of the second current, and the third current.

The first set of current sources, the second set of current sources, and the binary code-controlled current source array may each include at least one current source configured to provide a unit of current. The first current comprises a first fraction of the unit of current, the second current comprises a second fraction of the unit of current, and the third current comprises a multiple of the unit of current. In some cases, a sum of the portion of the first current and the portion of the second current is less than the unit of current. The method may also comprise converting at least two binary-coded bits to at least three of the thermometer-coded bits and activating, based on the thermometer-coded bits, respective switches associated with the multiple current sources of the DAC circuit to provide the current.

In an example aspect, a DAC circuit is disclosed that comprises a first set of current sources having outputs coupled to an output of the DAC circuit via respective ones of a first set of switches. A second set of current sources of the DAC circuit have outputs coupled, via a second set of switches, to respective taps of a resistor network of the DAC circuit. The DAC circuit also comprises means for providing, based on thermometer-coded bits, current via multiple current sources of a third set of current sources. The DAC circuit includes means for summing current provided by the multiple current sources to provide summed current. The DAC circuit also includes means for injecting the summed current into a node located between the output of the DAC circuit and a first terminal of a resistor having a second terminal coupled to the output of the DAC circuit.

In some cases, the DAC circuit further comprises means for receiving a digital input value, means for decoding a portion of the digital input value to provide the thermometer-coded bits, and means for controlling, via the thermometer-coded bits, the means for providing the current via the multiple current sources of the third set of current sources. Alternately or additionally, the DAC circuit may include means for sinking at least a portion of the summed current to a reference voltage node. The DAC may be implemented as part of a differential DAC, a current-steering DAC, a receiver circuit, or an audio code-decoder circuit.

Although subject matter has been described in language specific to structural features or methodological operations, it is to be understood that the subject matter defined in the appended claims is not necessarily limited to the specific features or operations described herein, including not necessarily being limited to the organizations in which features are arranged or the orders in which operations are performed.

What is claimed is:

1. An apparatus comprising a digital-to-analog conversion (DAC) circuit for converting a digital input to an analog signal, the DAC circuit comprising:
   a first set of current sources having outputs coupled to an output of the DAC circuit via respective ones of a first set of switches;
   a second set of current sources having outputs coupled to respective taps of a resistor network via a second set of switches;
   a third set of current sources having outputs coupled, via respective ones of a third set of switches, to a node located between an output of the resistor network and a first terminal of a first resistor that has a second terminal coupled to the output of the DAC circuit; and
   a second resistor coupled between the node and a reference voltage.

2. The apparatus as recited in claim 1, wherein:
   the output of the resistor network is provided via a resistor of the resistor network; and
   a resistance value of the first resistor having the second terminal coupled to the output of the DAC circuit is greater than a resistance value of the resistor of the resistor network or an effective resistance of the resistor network.

3. The apparatus as recited in claim 2, wherein a total resistance between at least the node and the output of the DAC circuit is greater than the resistance value of the resistor of the resistor network or the effective resistance of the resistor network.

4. The apparatus as recited in claim 1, wherein the DAC circuit further comprises code-converting circuitry that includes:
   an input configured to receive binary-coded bit values;
   logic configured to convert the binary-coded bit values to thermometer-coded bit values; and
   an output configured to control individual ones of the third set of switches based on respective values of the thermometer-coded bit values.

5. The apparatus as recited in claim 1, wherein the DAC circuit further comprises decode logic that includes:
   an input configured to receive a digital value;
   decoding logic configured to decode the digital value into a first set of thermometer-coded bit values, a second set of thermometer-coded bit values, and a set of binary-coded bit values;
   a first output configured to control the first set of switches based on the first set of thermometer-coded bit values;
   a second output configured to control the second set of switches based on the second set of thermometer-coded bit values; and
   a third output configured to control the third set of switches based on the set of binary-coded bit values.

6. The apparatus as recited in claim 1, wherein resistors of the resistor network are configured as a resistor-2resistor ladder.

7. The apparatus as recited in claim 1, wherein the DAC circuit further comprises a capacitor having a first terminal coupled to the first terminal of the first resistor and a second terminal coupled to the second terminal of the first resistor.

8. The apparatus as recited in claim 1, wherein the apparatus comprises a computing device, a system-on-chip, an audio coder-decoder component, a precision controller, a measurement instrument, or an analog-to-digital converter.

9. The apparatus as recited in claim 1, wherein the DAC circuit further comprises a capacitor coupled between the node and the reference voltage.

10. The apparatus as recited in claim 1, wherein the DAC circuit is implemented as part of a differential DAC, a current-steering DAC, a transmitter, a transceiver, or an audio coder-decoder of the apparatus.

11. A digital-to-analog converter (DAC) circuit for converting a digital value to an analog signal, the DAC circuit comprising:
   a first resistor network of first resistors coupled in series with each other and second resistors coupled to a reference voltage, each of the first resistors having a terminal connectable to respective ones of a first set of current sources and coupled to the reference voltage via one of the second resistors;
   a second resistor network that includes at least a third resistor coupled between the first resistor network and an output of the DAC circuit, the second resistor network having a node connectable to two or more current sources of a second set of current sources; and
   a third set of current sources that are individually connectable to the output of the DAC circuit.

12. The DAC circuit as recited in claim 11, wherein:
   the node is located at a terminal of the third resistor of the second resistor network; and
   the DAC circuit further comprises a set of switches coupled between the terminal of the third resistor and the second set of current sources, each switch of the set of switches being coupled between the terminal of the third resistor and a respective one of the second set of current sources.

13. The DAC circuit as recited in claim 11, wherein a resistance value of the third resistor greater than a resistance value of one or more of the first resistors of the first resistor network.

14. The DAC circuit as recited in claim 11, wherein the second resistor network further comprises:

a fourth resistor coupled between the node and a terminal of the third resistor; or a fifth resistor coupled between the node and the reference voltage.

15. The DAC circuit as recited in claim 14, further comprising a capacitor coupled in parallel with the fourth resistor or the fifth resistor of the second resistor network.

16. The DAC circuit as recited in claim 11, wherein the second resistor network further comprises a fourth resistor coupled between a terminal of the third resistor of the second resistor network and the reference voltage.

17. The DAC circuit as recited in claim 11, further comprising a capacitor coupled between a terminal of the third resistor of the second resistor network and the reference voltage.

18. The DAC circuit as recited in claim 11, further comprising a capacitor coupled in parallel with the third resistor of the second resistor network.

19. The DAC circuit as recited in claim 11, wherein the DAC circuit is implemented as part of a differential DAC, a current-steering DAC, a transmitter, a transceiver, or an audio coder-decoder.

20. A method comprising:
providing, based on thermometer-coded bits, current via multiple current sources of a digital-to-analog converter (DAC) circuit;
summing the current provided by the multiple current sources of the DAC circuit to provide summed current; and
injecting the summed current at a node located between a resistor network coupled to a binary code-controlled current source array of the DAC circuit and a resistor coupled to an output of the DAC circuit.

21. The method as recited in claim 20, wherein:
a first terminal of the resistor is coupled to the output of the DAC circuit;
a second terminal of the resistor is coupled to a terminal of another resistor of the resistor network; and
the second terminal of the resistor and the terminal of the other resistor are coupled to the node at which the summed current is injected.

22. The method as recited in claim 21, wherein:
a resistance value of the resistor is greater than a resistance value of the other resistor of the resistor network; or
a total resistance value of the resistor and additional resistors disposed between the node and the output of the DAC circuit is greater than the resistance value of the other resistor of the resistor network.

23. The method as recited in claim 20, wherein the summed current comprises a first current, the multiple current sources comprise a first set of current sources, and the method further comprises:
providing, based on binary-coded bits, a second current via one or more current sources of the binary code-controlled current source array;
providing, based on other thermometer-coded bits, a third current via one or more current sources of a second set of current sources that are coupled to the output of the DAC circuit; and
providing, at the output of the DAC circuit, an output current than includes a portion of the first current, a portion of the second current, and the third current.

24. The method as recited in claim 23, wherein:
the first set of current sources, the second set of current sources, and the binary code-controlled current source array each include at least one current source configured to provide a unit of current;
the first current comprises a first fraction of the unit of current;
the second current comprises a second fraction of the unit of current; and
the third current comprises a multiple of the unit of current.

25. The method as recited in claim 24, wherein a sum of the portion of the first current and the portion of the second current is less than the unit of current.

26. The method as recited in claim 20, wherein the providing comprises:
converting at least two binary-coded bits to at least three of the thermometer-coded bits; and
activating, based on the thermometer-coded bits, respective switches associated with the multiple current sources of the DAC circuit to provide the current.

27. A digital-to-analog conversion (DAC) circuit, the DAC circuit comprising:
a first set of current sources having outputs coupled to an output of the DAC circuit via respective ones of a first set of switches;
a second set of current sources having outputs coupled, via a second set of switches, to respective taps of a resistor network of the DAC circuit;
means for providing, based on thermometer-coded bits, current via multiple current sources of a third set of current sources;
means for summing current provided by the multiple current sources to provide summed current; and
means for injecting the summed current into a node located between the output of the DAC circuit and a first terminal of a resistor having a second terminal coupled to the output of the DAC circuit.

28. The DAC circuit as recited in claim 27, further comprising:
means for receiving a digital input value;
means for decoding a portion of the digital input value to provide the thermometer-coded bits; and
means for controlling, via the thermometer-coded bits, the means for providing the current via the multiple current sources of the third set of current sources.

29. The DAC circuit as recited in claim 27, further comprising means for sinking at least a portion of the summed current to a reference voltage node.

30. The DAC circuit as recited in claim 27, wherein the DAC circuit is implemented as part of a differential DAC, a current-steering DAC, a transmitter, a transceiver, or an audio code-decoder.

* * * * *